United States Patent
Balakrishnan et al.

(10) Patent No.: US 9,837,152 B2
(45) Date of Patent: Dec. 5, 2017

(54) INDEPENDENT SENSE AMPLIFIER ADDRESSING AND QUOTA SHARING IN NON-VOLATILE MEMORY

(71) Applicant: SanDisk Technologies LLC, Plano, TX (US)

(72) Inventors: Gopinath Balakrishnan, Santa Clara, CA (US); Yibo Yin, Sunnyvale, CA (US); Tianhong Yan, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/392,852

(22) Filed: Dec. 28, 2016

(65) Prior Publication Data
US 2017/0110189 A1    Apr. 20, 2017

Related U.S. Application Data

(62) Division of application No. 14/619,985, filed on Feb. 11, 2015, now Pat. No. 9,564,215.

(51) Int. Cl.
*G11C 8/00*  (2006.01)
*G11C 13/00* (2006.01)

(52) U.S. Cl.
CPC ........ *G11C 13/0069* (2013.01); *G11C 13/004* (2013.01); *G11C 13/0026* (2013.01);
(Continued)

(58) Field of Classification Search
CPC ........ G11C 7/1021; G11C 7/1039; G11C 7/06
(Continued)

(56) References Cited

U.S. PATENT DOCUMENTS

| 4,926,312 A | 5/1990 | Nukiyama |
| 5,890,192 A | 3/1999 | Lee |

(Continued)

FOREIGN PATENT DOCUMENTS

| EP | 1282134 | 2/2003 |
| WO | WO2006/130438 | 12/2006 |

(Continued)

OTHER PUBLICATIONS

Restriction Requirement dated Jun. 8, 2016, U.S. Appl. No. 14/619,985, filed Feb. 11, 2015 by Balakrishnan et al.

(Continued)

*Primary Examiner* — Han Yang
(74) *Attorney, Agent, or Firm* — Vierra Magen Marcus LLP

(57) ABSTRACT

Independent sense amplifier addressing provides separate column addresses to individual sense amplifier groups within a single bay during one column address cycle. A memory system determines whether the individual memory cells or bits of a column at a bay can be skipped. For each sense amplifier group having at least one memory cell (or bit) that needs to be programmed, the system determines for the first column address whether the memory cell can be skipped. If a bit or memory cell having a first column address from the sense amplifier group can be skipped, the system determines a next bit having a column address from the group that needs to be programmed. The system groups the next column address for programming during the first column address cycle. The system can program a different column address for different sense amplifier groups within the bay during a single column address cycle.

20 Claims, 21 Drawing Sheets

|  | CAD Cycle #1 | | CAD Cycle #2 | | CAD Cycle #3 | | CAD Cycle #4 |
|---|---|---|---|---|---|---|---|
| SA Group 602-1 | CAD0 | Bit 1 | CAD1 | Bit 6 | CAD2 | Bit 3 | Skip |
| SA Group 602-2 | CAD0 | Skip | CAD1 | Bit 10 | CAD2 | Bit 15 | |
| SA Group 602-3 | CAD0 | Skip | CAD1 | Skip | CAD2 | Skip | |
| SA Group 602-4 | CAD0 | Skip | CAD1 | Skip | CAD2 | Skip | |

(52) U.S. Cl.
CPC ...... *G11C 13/0028* (2013.01); *G11C 13/0064* (2013.01); *G11C 13/0097* (2013.01)

(58) Field of Classification Search
USPC ............................... 365/230.01, 230.05, 205
See application file for complete search history.

(56) References Cited

U.S. PATENT DOCUMENTS

| | | | |
|---|---|---|---|
| 6,029,226 | A | 2/2000 | Ellis |
| 6,201,738 | B1 | 3/2001 | Hebishima |
| 6,735,104 | B2 | 5/2004 | Scheuerlein |
| 7,111,140 | B2 | 9/2006 | Estakhri |
| 7,142,471 | B2 | 11/2006 | Fasoli |
| 7,219,271 | B2 | 5/2007 | Kleveland et al. |
| 7,243,203 | B2 | 7/2007 | Scheuerlein |
| 7,383,476 | B2 | 6/2008 | Crowley |
| 7,424,593 | B2 | 9/2008 | Estakhri |
| 7,490,283 | B2 | 2/2009 | Gorobets |
| 7,499,366 | B2 | 3/2009 | Scheuerlein |
| 7,502,260 | B2 | 3/2009 | Li |
| 7,545,689 | B2 | 6/2009 | Ilkbahar et al. |
| 7,685,376 | B2 | 3/2010 | Zimmer et al. |
| 7,804,724 | B2 | 9/2010 | Way |
| 7,966,532 | B2 | 6/2011 | Bottelli et al. |
| 8,004,926 | B2 | 8/2011 | Sutardja et al. |
| 8,213,243 | B2 | 7/2012 | Balakrishnan et al. |
| 8,223,525 | B2 | 7/2012 | Balakrishnan et al. |
| 8,374,051 | B2 | 2/2013 | Yan et al. |
| 8,397,024 | B2 | 3/2013 | Fasoli et al. |
| 8,947,944 | B2 | 2/2015 | Balakrishnan et al. |
| 8,947,972 | B2 | 2/2015 | Balakrishnan et al. |
| 2001/0005876 | A1 | 6/2001 | Srinivasan |
| 2001/0017798 | A1 | 8/2001 | Ishii |
| 2002/0041527 | A1 | 4/2002 | Tanaka |
| 2002/0136045 | A1 | 9/2002 | Scheuerlein |
| 2004/0188714 | A1 | 9/2004 | Scheuerlein |
| 2004/0190360 | A1 | 9/2004 | Scheuerlein |
| 2004/0250183 | A1 | 12/2004 | Crowley |
| 2004/0255088 | A1 | 12/2004 | Scheuerlein |
| 2006/0077720 | A1 | 4/2006 | Im |
| 2006/0146639 | A1 | 7/2006 | Fasoli |
| 2007/0147133 | A1 | 6/2007 | Im |
| 2008/0151637 | A1 | 6/2008 | Doyle |
| 2009/0161474 | A1 | 6/2009 | Scheuerlein |
| 2009/0244987 | A1 | 10/2009 | Cernea |
| 2010/0046267 | A1 | 2/2010 | Yan |
| 2010/0146189 | A1 | 6/2010 | Otterstedt et al. |
| 2010/0265750 | A1 | 10/2010 | Yan |
| 2011/0047330 | A1 | 2/2011 | Potapov et al. |
| 2011/0141788 | A1 | 6/2011 | Balakrishnan et al. |
| 2012/0002457 | A1 | 1/2012 | Kanda |
| 2012/0236663 | A1 | 9/2012 | Balakrishnan |
| 2012/0275210 | A1 | 11/2012 | Yan et al. |
| 2014/0063948 | A1* | 3/2014 | Lim ................ G11C 16/06 365/185.11 |
| 2014/0269106 | A1* | 9/2014 | Balakrishnan ........... G11C 7/06 365/189.05 |
| 2015/0106554 | A1 | 4/2015 | Balakrishnan |
| 2016/0232969 | A1 | 8/2016 | Balakrishnan et al. |

FOREIGN PATENT DOCUMENTS

| | | |
|---|---|---|
| WO | WO2012/118618 A1 | 9/2012 |
| WO | WO2012/129083 A1 | 9/2012 |

OTHER PUBLICATIONS

Response to Restriction Requirement dated Aug. 3, 2016, U.S. Appl. No. 14/619,985, filed Feb. 11, 2015 by Balakrishnan et al.
Notice of Allowance dated Aug. 31, 2016, U.S. Appl. No. 14/619,985, filed Feb. 11, 2015 by Balakrishnan et al.
Non-final Office Action dated Nov. 4, 2016, U.S. Appl. No. 14/515,387, filed Oct. 15, 2014.
Response to Office Action filed Mar. 27, 2017, U.S. Appl. No. 14/515,387, filed Oct. 15, 2014.
Notice of Allowance dated Apr. 20, 2017, U.S. Appl. No. 14/515,387, filed Oct. 15, 2014.

* cited by examiner

| | CAD Cycle #1 | | CAD Cycle #2 | | CAD Cycle #3 | | CAD Cycle #4 |
|---|---|---|---|---|---|---|---|
| SA Group 602-1 | CAD0 | Bit 1 | CAD1 | Bit 6 | CAD2 | Bit 3 | Skip |
| SA Group 602-2 | CAD0 | Skip | CAD1 | Bit 10 | CAD2 | Bit 15 | |
| SA Group 602-3 | CAD0 | Skip | CAD1 | Skip | CAD2 | Skip | |
| SA Group 602-4 | CAD0 | Skip | CAD1 | Skip | CAD2 | Skip | |

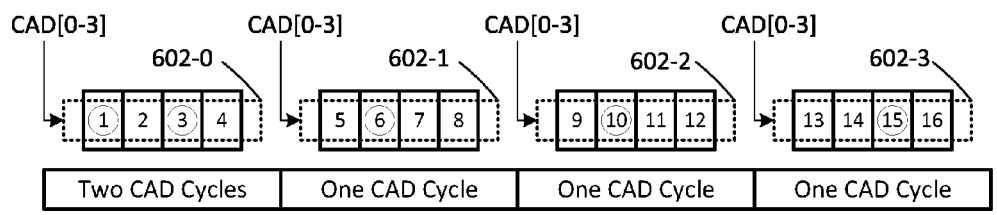
*Fig. 16a*
| | CAD Cycle #1 | | CAD Cycle #2 | | CAD Cycle #3 | CAD Cycle #4 |
|---|---|---|---|---|---|---|
| SA Group 602-0 | CAD0 | Bit 1 | CAD2 | Bit 3 | Skip | Skip |
| SA Group 602-1 | CAD1 | Bit 6 | Skip | Skip | | |
| SA Group 602-2 | CAD1 | Bit 10 | Skip | Skip | | |
| SA Group 602-3 | CAD2 | Bit 15 | Skip | Skip | | |
*Fig. 16b*
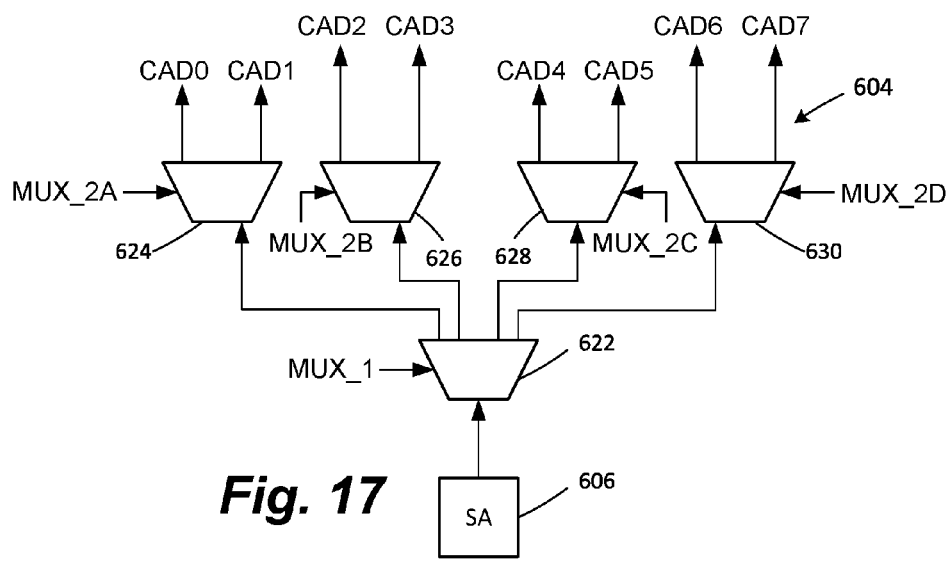
*Fig. 17*

| | CAD Cycle #1 | | CAD Cycle #2 | | CAD Cycle #3 | | CAD Cycle #4 | |
|---|---|---|---|---|---|---|---|---|
| SA Group 602-1 | Skip | Skip | Skip | Skip | Skip | Skip | Skip | Skip |
| SA Group 602-2 | Skip | Skip | Skip | Skip | Skip | Skip | Skip | Skip |
| SA Group 602-3 | Skip | Skip | Skip | Skip | Skip | Skip | Skip | Skip |
| SA Group 602-4 | CAD0 | Bit 13 | CAD1 | Bit 14 | CAD2 | Bit 15 | CAD3 | Bit 16 |

| SA Group 602-4 | CAD Cycle #1 | | CAD Cycle #2 | CAD Cycle #3 | CAD Cycle #4 |
|---|---|---|---|---|---|
| SA1 | CAD0 | Bit 13 | Skip | Skip | Skip |
| SA2 | CAD1 | Bit 14 | | | |
| SA3 | CAD2 | Bit 15 | | | |
| SA4 | CAD3 | Bit 16 | | | |

INDEPENDENT SENSE AMPLIFIER ADDRESSING AND QUOTA SHARING IN NON-VOLATILE MEMORY

CLAIM OF PRIORITY

The present application is a divisional application of U.S. patent application Ser. No. 14/619,985, now U.S. Pat. No. 9,564,215, entitled "INDEPENDENT SENSE AMPLIFIER ADDRESSING AND QUOTA SHARING IN NON-VOLATILE MEMORY," filed Feb. 11, 2015 and incorporated herein by reference in its entirety.

BACKGROUND OF THE INVENTION

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

BRIEF DESCRIPTION OF THE DRAWINGS

FIG. 14a is a block diagram depicting a bay and the results of an example of a skip analysis using a single column address within a bay during column address cycles.

FIG. 14b is a table describing the column addressing during different cycles according to the example of FIG. 14a.

FIG. 16a is a block diagram depicting a bay and the results of an example of a skip analysis using independent column addressing within a bay during column address cycles.

FIG. 16b is a table describing the column addressing during different cycles according to the example of FIG. 16a.

FIG. 17 is a simplified circuit diagram showing multiplexer circuitry for independently assigning column addresses to a sense amplifier within a bay.

FIG. 19a is a block diagram depicting a bay and the results of an example of a skip analysis using independent column addressing with an independent quota of parallel programming bits for each sense amplifier group.

FIG. 19b is a table describing the column addressing during different cycles according to the example of FIG. 19a.

FIG. 20a is a block diagram depicting a bay and the results of an example of a skip analysis using independent column addressing with a shared quota of parallel programming bits within a bay.

FIG. 20b is a table describing the column addressing during different cycles according to the example of FIG. 20a.

DETAILED DESCRIPTION

Figure 1:
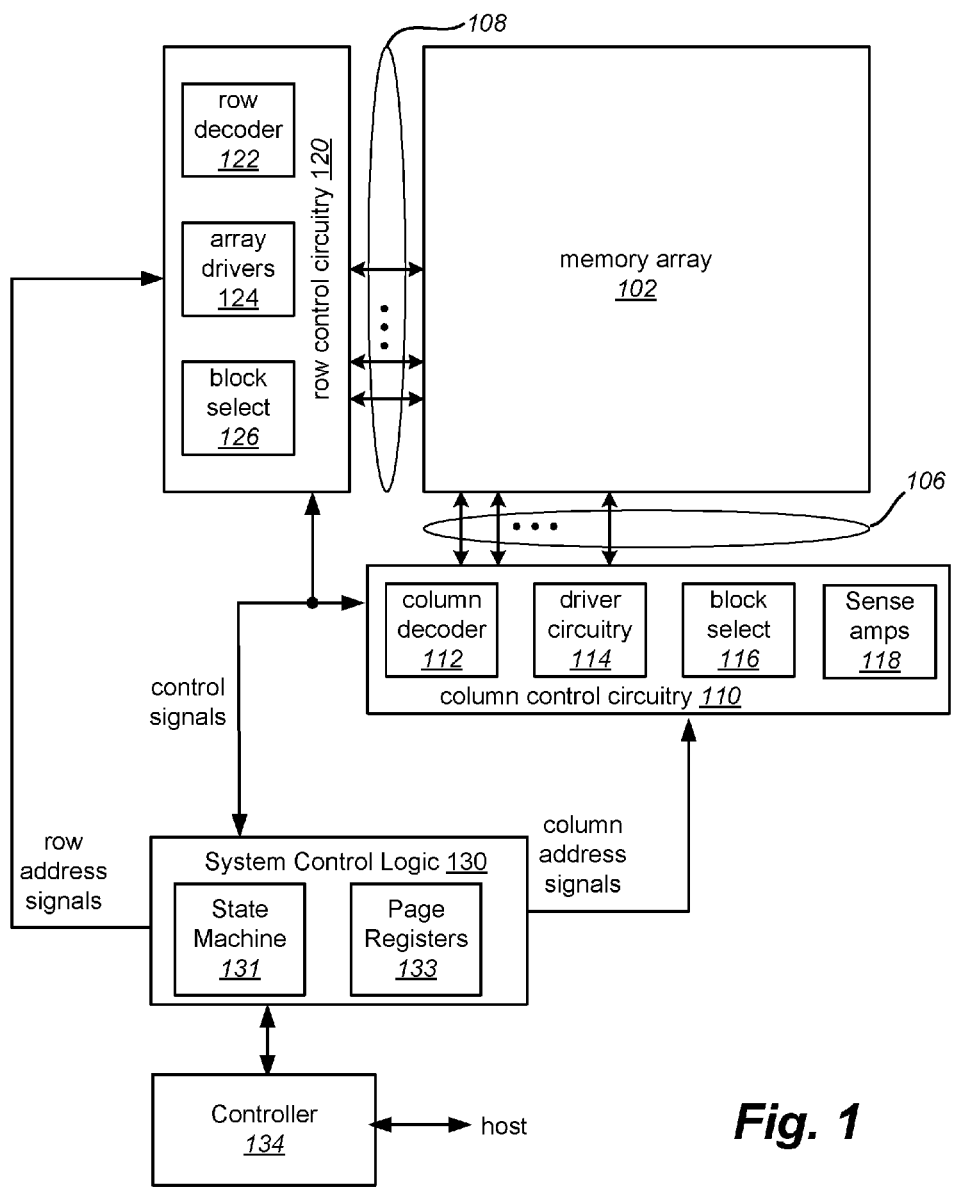
FIG. 1 is a block diagram of one embodiment of a non-volatile memory system.

The disclosed technology is directed to non-volatile memory that utilizes multiple programming cycles to write units of data, such as a logical page of data to a non-volatile memory array. Many non-volatile memory arrays utilize bays that contain a plurality of blocks of memory cells within a memory array. Each bay may contain a set of sense amplifiers that are shared by all of the blocks within the bay. The bays may be combined into groups that are selected for programming using a common bay address (BAD) to select a BAD group for a BAD cycle. The memory cells may also be divided into columns that span multiple bays. Each bay includes a subset of memory cells from each of the columns. Within a BAD cycle, multiple column address (CAD) cycles are used. A CAD is used to select a column of memory cells for programming during a CAD cycle. Within a bay, a sense amplifier may be used for a group of memory cells that includes one non-volatile storage element from each of the columns.

A non-volatile memory system in one embodiment evaluates user data before writing to determine whether programming can be skipped to reduce the number of BAD cycles and/or CAD cycles used for programming. The system compares the user data for a write request with memory data read from the array to determine if programming can be skipped for particular bits or memory cells corresponding to the write operation. The skip analysis can be performed before an initial write operation and/or before retry requests after unsuccessful programming iterations.

A non-volatile memory in one embodiment utilizes independent sense amplifier addressing for the sense amplifier groups within a bay. Independent sense amplifier addressing permits the system to provide separate column addresses to individual sense amplifier groups within a single bay during one column address cycle. The system can first determine whether programming can be skipped for a particular column address including a column of memory cells across a bay group. If a column address cannot be skipped, the system determines whether the subsets of memory cells of the column at each bay can be skipped. If the subsets of memory cells of the column may be not be skipped, using independent column addressing for example, the system determines whether the individual memory cells or bits of the column at the bay can be skipped. For each sense amplifier group having at least one memory cell (or bit) that needs to be programmed, the system determines for the first column address whether the memory cell can be skipped. If a bit or memory cell having a first column address from the sense amplifier group can be skipped, the system determines a next bit having a column address from the group that needs to be programmed. The system then groups the next column address for programming during the first column address cycle. The system can program a different column address for different sense amplifier groups within the bay during a single column address cycle. In this manner, the system may reduce the number of column address cycles required to program a particular bay.

In one embodiment, the system uses a shared quota across sense amplifier groups to permit programming of multiple column addresses at one group during a single column address cycle, while maintaining programming within a bay to a maximum number of parallel bits. When a bit for one column address is skipped during a column address cycle, the system determines whether another bit can be programmed while remaining within the shared quota. In this manner, independent column addressing of sense amplifiers can be used to program multiple memory cells from a sense amplifier group during one column address cycle. In one embodiment, each sense amplifier group may be associated with multiple sense amplifiers, such as providing a sense amplifier for each memory cell. The system addresses the different sense amplifiers within a group for selection during a single column address cycle. In another embodiment, a sense amplifier from a first sense amplifier group may address a memory cell from a second sense amplifier group to permit programming of multiple memory cells within a sense amplifier group during a single column address cycle.

The system utilizes a weighted quota sharing scheme in one embodiment to account for differences in voltage drop across the memory cells of a word line within a bay. For example, the voltage drop is typically larger for memory cells further from the word line driver of a word line, increasing relative to the memory cell's distance from the driver. The system applies a first quota to a first zone of memory cells of a word line at a first distance from a word line driver. If the number of memory cells that needs to be programmed in the first zone is less than the first quota, the remainder of the first quota is used to generate a second quota that is applied to a second zone of memory cells of the word line that are further form the word line driver. In one example, the remainder of the first quota is divided to generate the second quota. Additional zones may be used with the remainder from a previous zone being decreased to generate the quota for an additional zone.

FIG. 1 is a block diagram that depicts one example of a memory system 100 that can be used to implement embodiments of the disclosed technology. Memory system 100 includes a memory array 102, which can be a two or three-dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133 and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be considered control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer.

In another embodiment, memory cells are re-writable. For example, a rewriteable non-volatile memory cell can include a diode or other select device coupled in series or another fashion with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
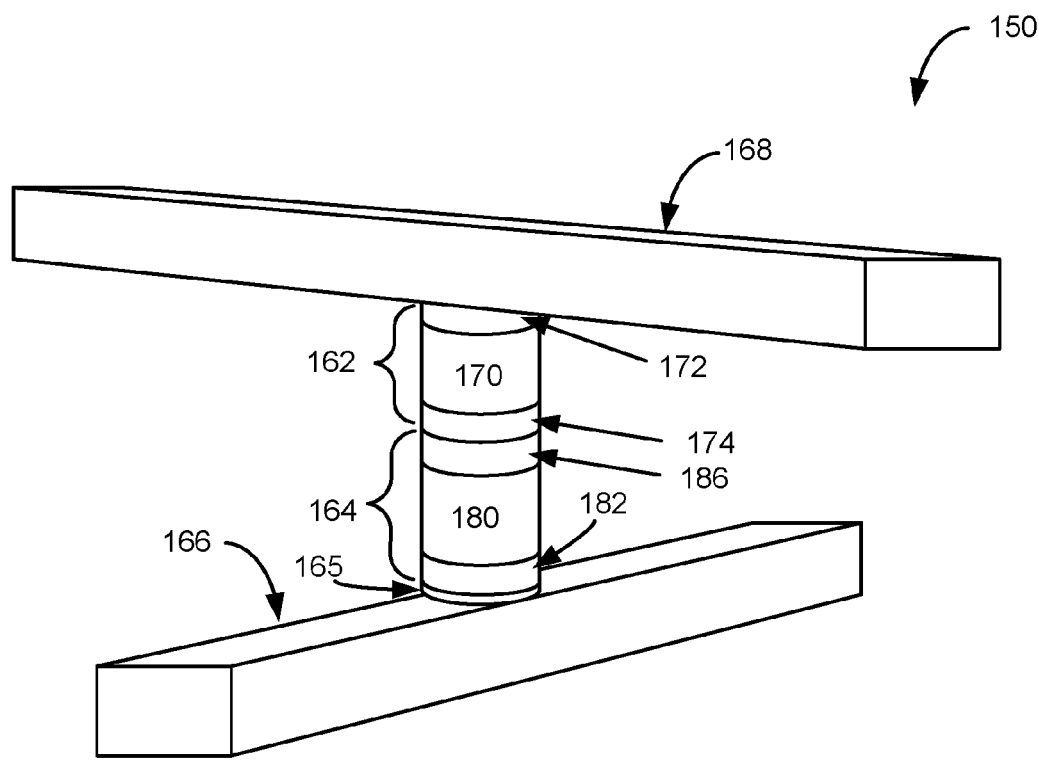
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168. Reversible resistance-switching element 162 includes reversible resistance-switching material 170 having a resistance that may be reversibly switched between two or more states. In some embodiments, reversible resistance-switching material 170 may be formed from a metal oxide.

Various different metal oxides can be used. In one example, nickel oxide is used. In one embodiment, the reversible resistance-switching material 170 includes at least a portion of a nickel oxide layer formed by selectively depositing nickel and then oxidizing the nickel layer. In other embodiments, nickel oxide itself may be selectively deposited. In other embodiments Hafnium oxide may be deposited by an atomic layer deposition process using a precursor containing Hafnium. Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described in Rose et al., U.S. Pat. No. 5,541,869. Another class of material is taught by Ignatiev et al. in U.S. Pat. No. 6,473,332: these are perovskite materials such as $Pr_1$-$XCa_X$-$MnO_3$ (PCMO), $La_1$-$XCa_X MnO_3$ (LCMO), $LaSrMnO_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as poly silicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164. While FIG. 2 shows one example of a memory cell, no one particular type or structure of a memory cell is required for the technology disclosed herein. Many different types of memory cells can be used.

Figure 3:
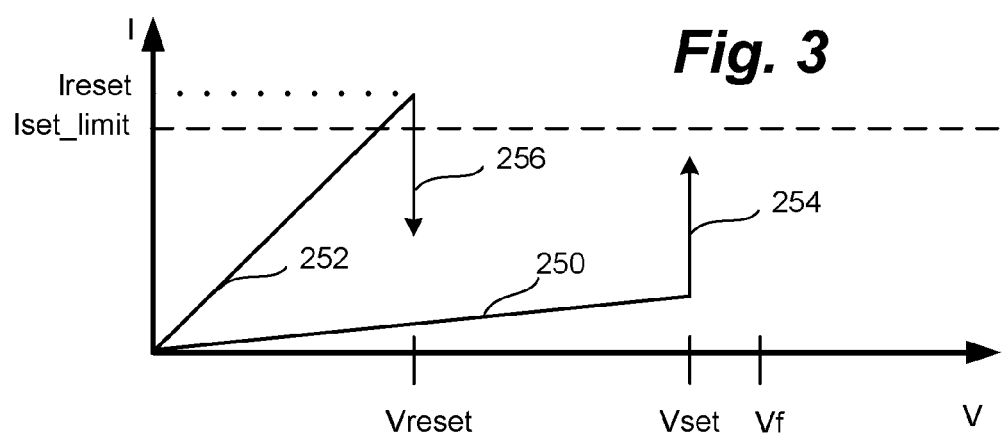
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
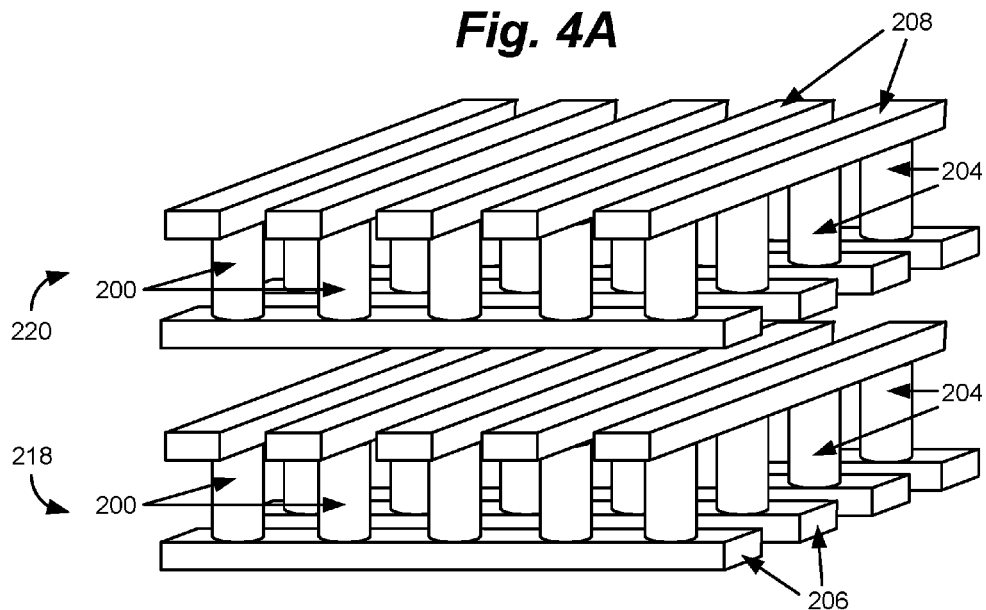
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
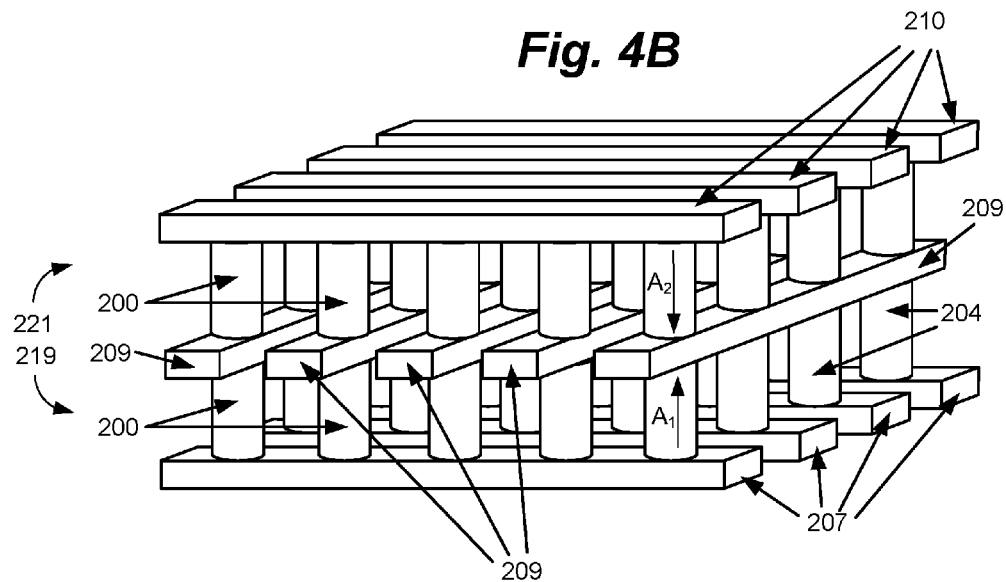
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B.

In the embodiment of FIG. 4B, the diodes (or other steering devices) on adjacent memory levels point in opposite directions in one example. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
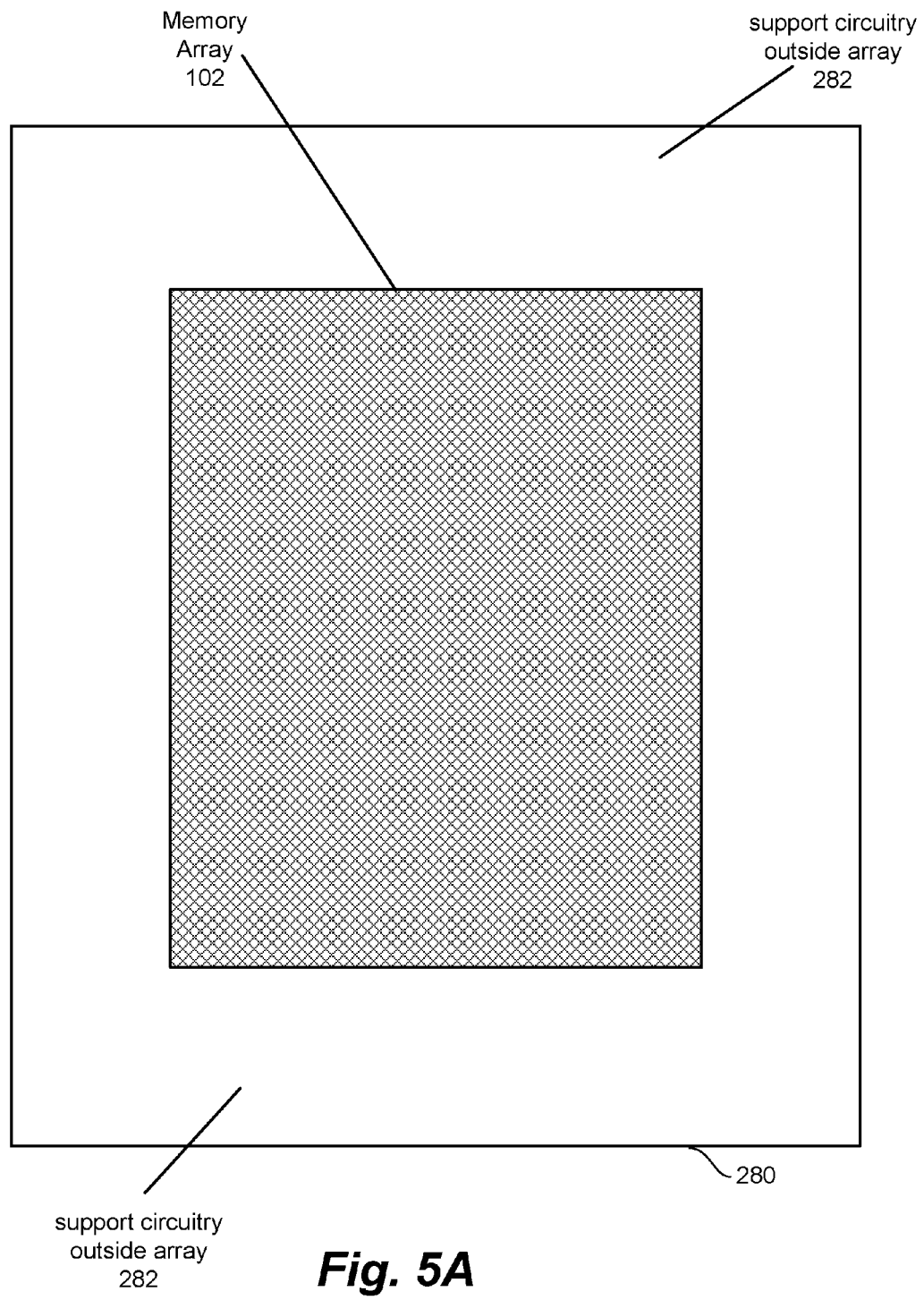
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there are additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
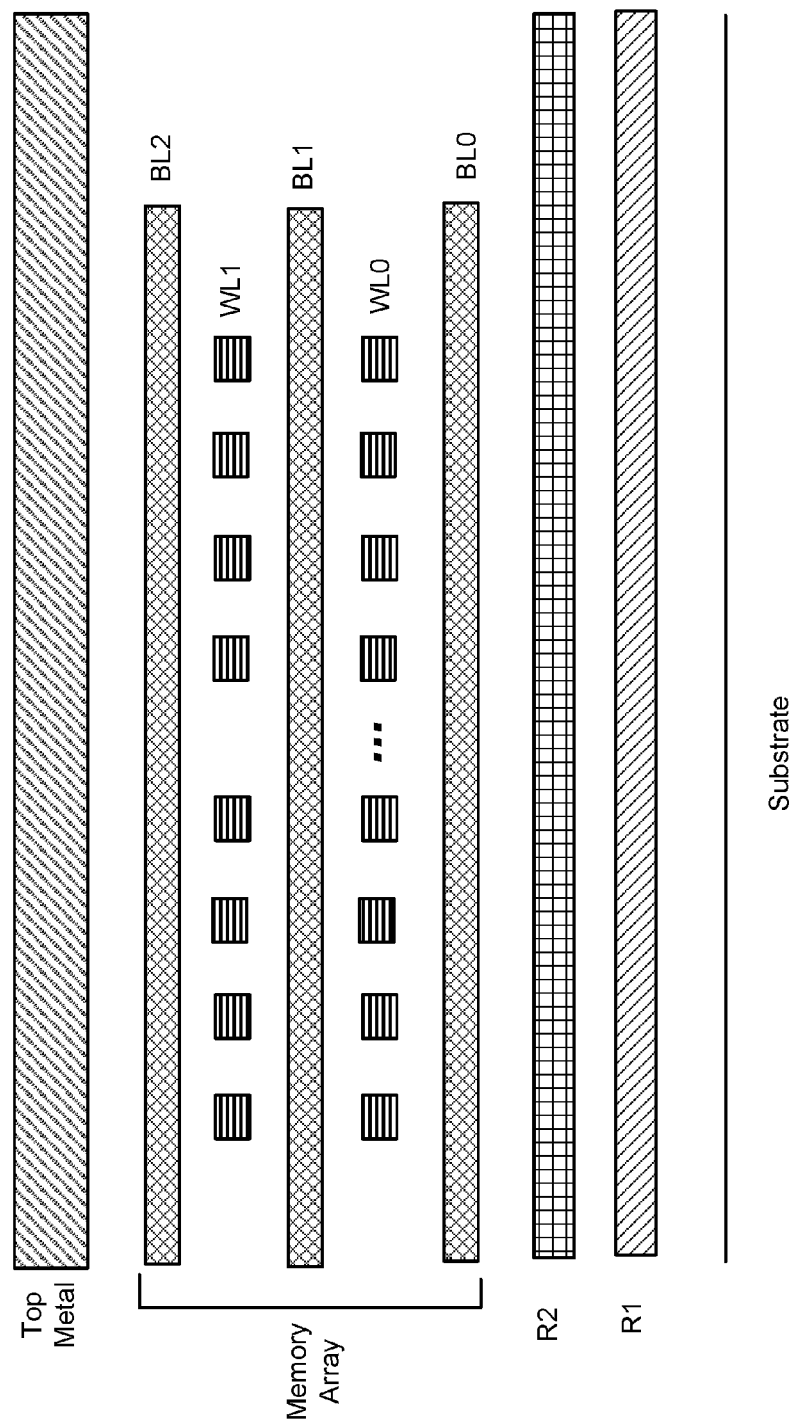
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
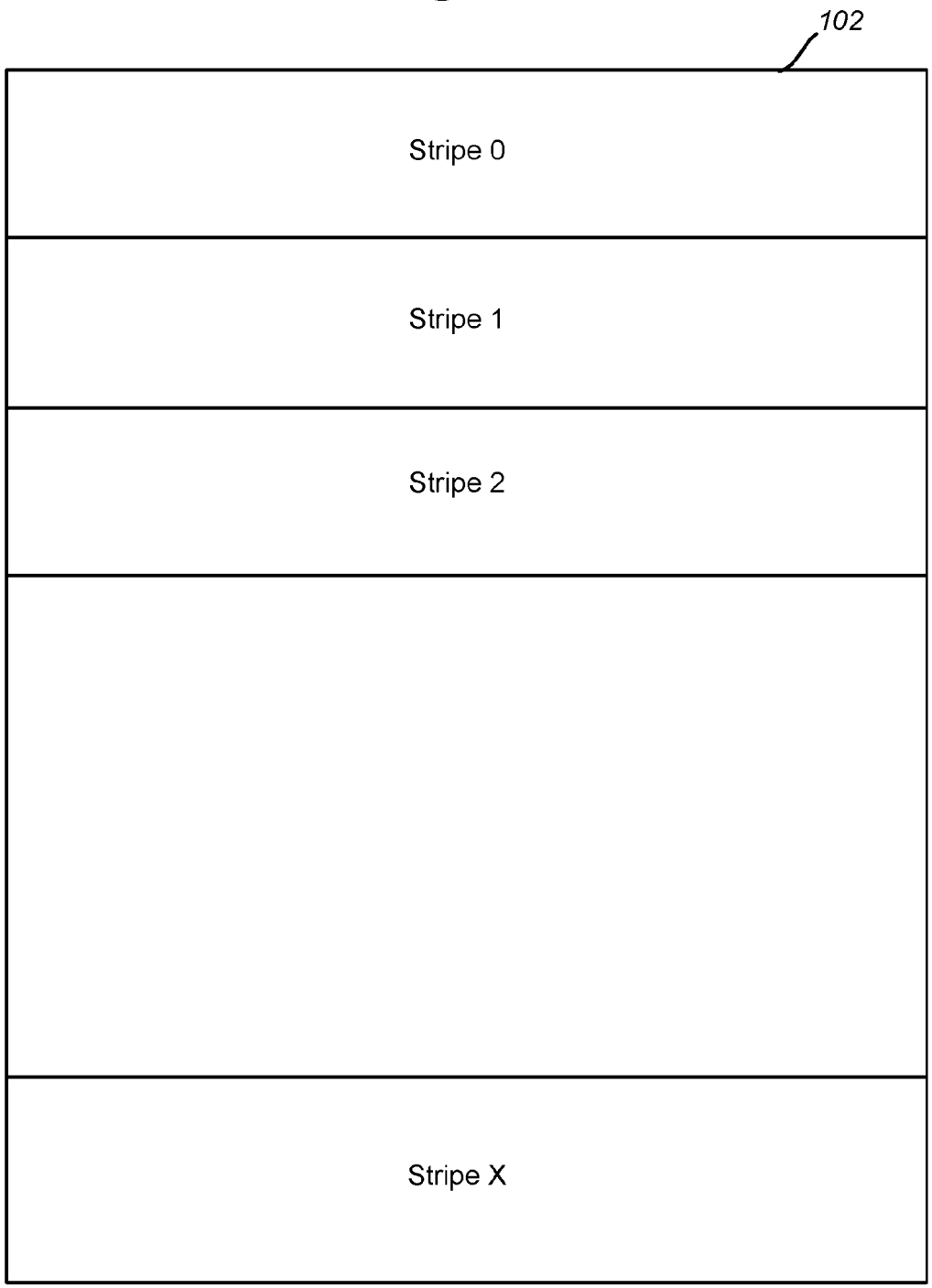
FIG. 6 depicts one example of an organization of a memory array.

Memory array 102 is subdivided into stripes, as depicted in FIG. 6. Each stripe is divided into blocks and blocks are grouped into bays. In one embodiment, each block includes two stripes. In other embodiments, one bay can be implemented in one stripe or a portion of one stripe. In some implementations, a bay can be implemented across all or portions of two or more stripes. Each bay includes multiple blocks. The number of blocks in a bay can vary.

Figure 7:
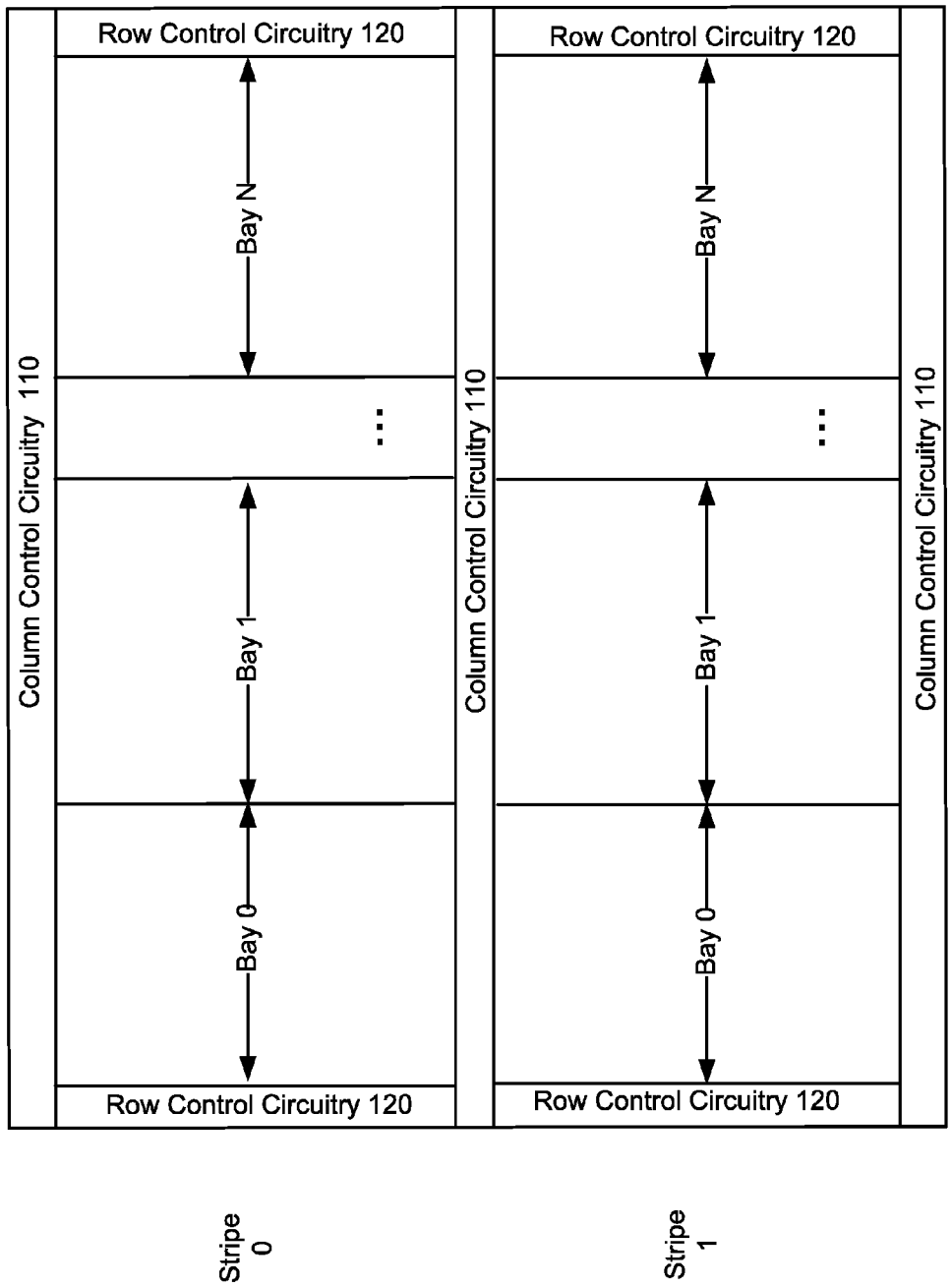
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
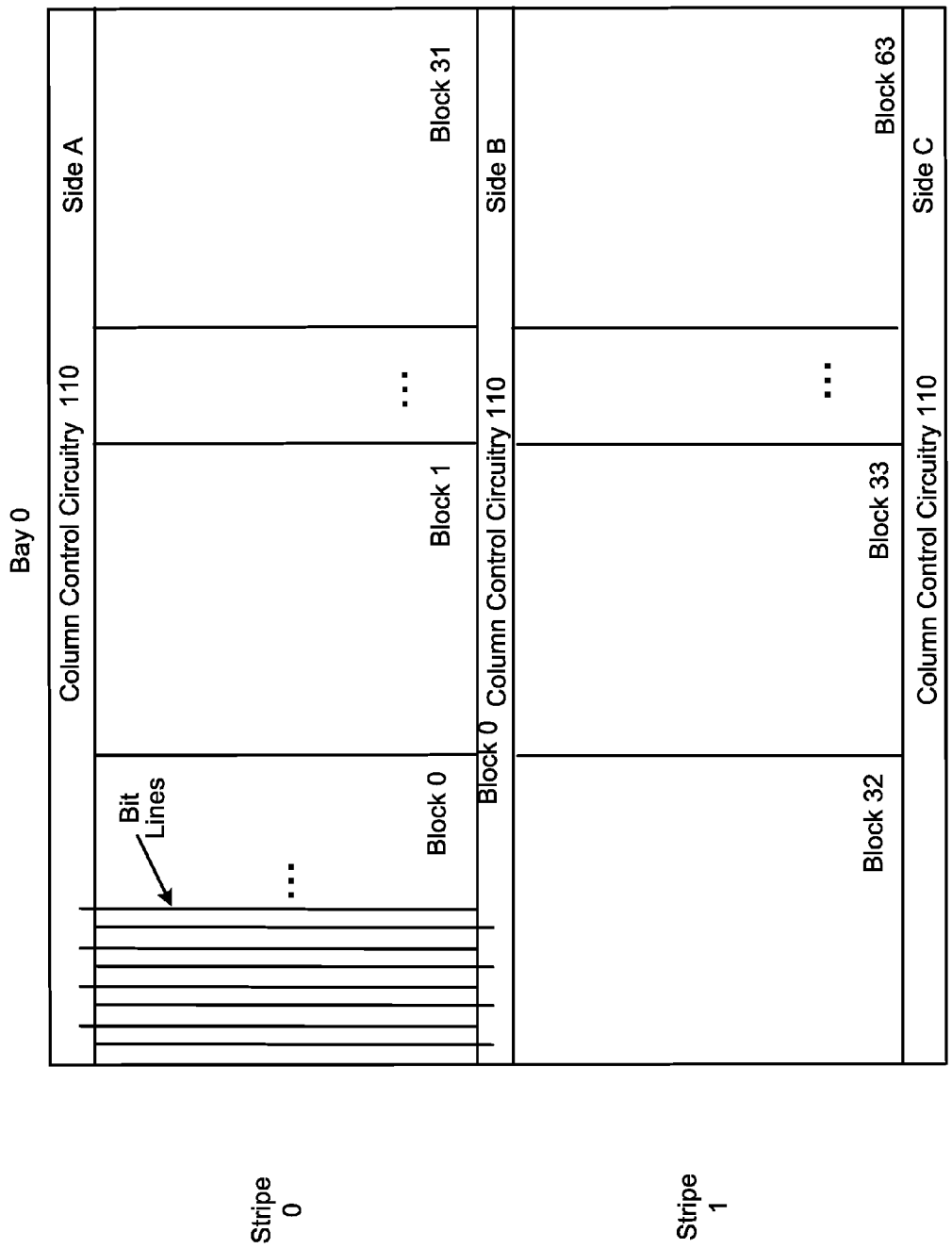
FIG. 8 depicts one embodiment of a bay.

FIG. 8 provides more details of one example of a bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and drive bit lines for its upper or bottom blocks.

In one embodiment, word lines (not depicted in FIG. 8) are shared by two adjacent blocks. For example, half of the word lines connected to Block 1 are also connected to Block 0 and the other half of the word lines connected to Block 1 are also connected to Block 2. In one example, every other word line connected to Block 1 is also connected to Block 0, with the intervening word lines also connected to Block 2. For embodiments with word lines shared by two adjacent blocks, the word line drivers are positioned on the substrate and between the two adjacent blocks. For example, a word line connected to Block 0 and Block 1 is driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

To reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 9:
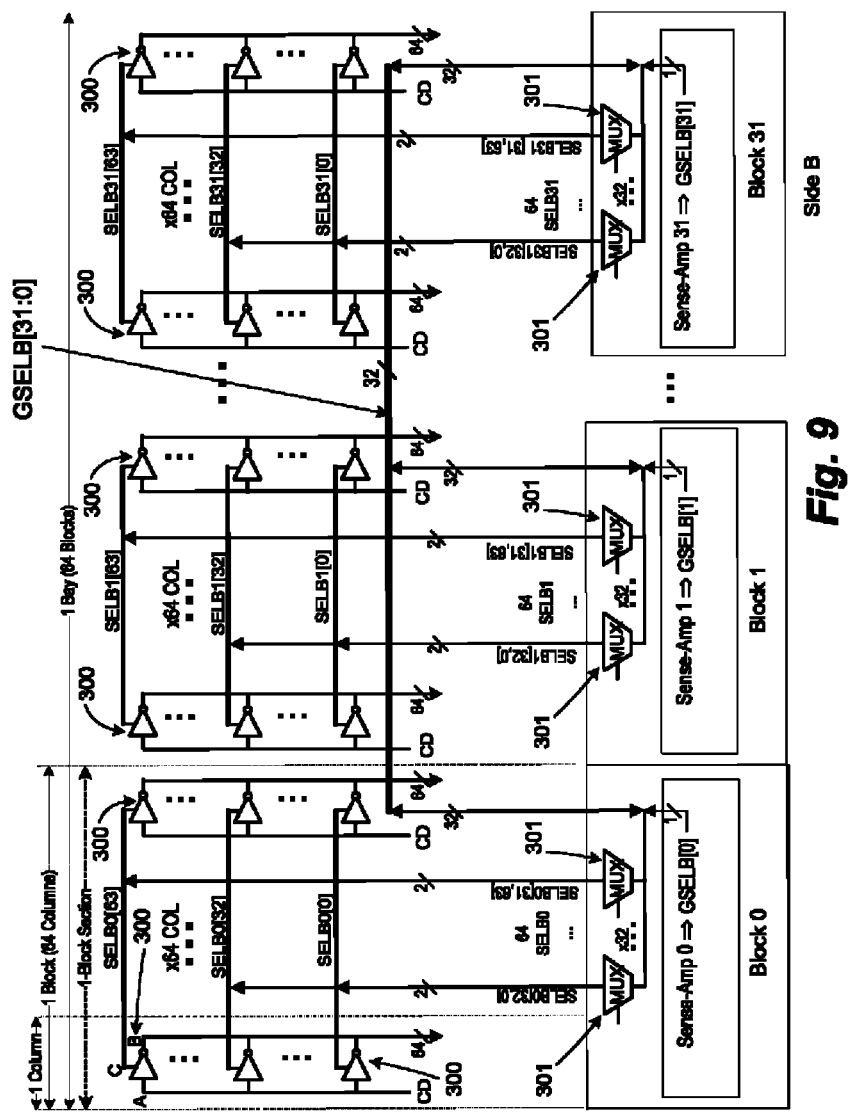
FIG. 9 is a schematic diagram of one embodiment of the data lines and selection circuits for connecting bit lines to the column control circuitry via the data lines.

FIG. 9 is a schematic diagram that depicts a portion of the routing signals and selection circuits for one embodiment of Column Control Circuitry 110. Depicted are portions of three blocks: Block 0, Block 1 and block 31. For each block, the bit lines are grouped into columns. Each block has 64 columns of selection circuits 300 for electrically connecting bit lines of the column to sense amplifiers on one side of the array (e.g. side A FIG. 8) and 64 columns of selection circuits for connecting bit lines to sense amplifiers on the other side of the array (e.g. side B of FIG. 8). FIG. 9 only shows the 64 columns of selection circuits 300 for connecting to side B. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has its own set of local data lines. For example, block 0 includes SELB0[63:0], block 1 includes SELB1[63:0], . . . block 31 includes SELB31[63:0]. In one embodiment, the local data lines SELB0[63:0], SELB1[63:0], . . . SELB31[63:0] are implemented in metal layer R1 under their respective block, and only run the width of the respective block. Selection circuits 300 for a particular column are used to selectively connect the 64 bit lines for that same column to 64 respective local data lines (SELB0[63:0], SELB1[63:0], . . . or SELB31[63:0]). As can be seen from FIG. 9, each of the selection circuits 300 receives a selection signal CD from column decoders 112 and a bit line connection from one of the 64 bit lines associated with the column. In one embodiment, each column will have its own selection signal CD. Based on the selection input from column decoder 112, the selection circuit 300 will connect or disconnect the bit line to a respective one of the local data lines (e.g., SELB0[63:0], SELB1[63:0], . . . SELB31[63:0]).

Looking back at FIG. 8, column decoders 112 choose one column and send to that chosen column a selection indication on the appropriate selection signal line CD so that the chosen column connects the respective 64 bit lines to the local data lines (SELB0[63:0], SELB1[63:0], . . . or SELB31[63:0]). Each block has its own set of thirty two 2:1 multiplexers (e.g., MUX 301) that are associated with the block and located on the substrate below the block. Each set of sixty four local data lines (SELB0[63:0], SELB1[63:0], . . . or SELB31[63:0]) are connected to a respective set of thirty two 2:1 multiplexers (MUX) for that respective block. For example, in block 0 the first multiplexer receives SELB0[0] and SELB0[32], the second multiplexer receives SELB0[1] and SELB0[33], . . . the thirty second multiplexer receives SELB0[31] and SELB0[63]. Each of the multiplexers in a block receives a common selection signal and an enable signal from column decoders 112 so that thirty two of the sixty four local data lines are selected. In one embodiment, the multiplexers include the ability to bias the unselected SELB with the unselected bit line voltage VUB.

The thirty two selected local data lines are connected to global data lines GSELB[31:0] so that a memory operation (e.g. Read, SET, RESET) is performed on the selected memory cells. For example, SELB0[0] is selectively connected to GSELB[0], SELB0[1] is selectively connected to GSELB[1], etc. or SELB0[32] is selectively connected to GSELB[0], SELB0[33] is selectively connected to GSELB[1], etc. The global data lines GSELB[31:0] are implemented in Top Metal and connections between global data lines GSELB[31:0] and multiplexers (MUX) are made using zias (or vias). The global data lines GSELB[31:0] run across the entire Bay, with each Bay having its own set of global data lines. To reduce coupling between global data lines, various forms of Top Metal isolation can be used.

Each of the global data lines GSELB[31:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB[1], . . . and the output Sense-Amp31 of the sense amplifier located underneath block 31 is connected to GSELB[31]. Thus, the output of a particular sense amplifier is connected to a global data line, then to a local data line by way of a multiplexer, and then to a bit line by way of a selection circuit 300. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-to-well parasitic cap) is reduced by having a sectional data-line, by reducing number of bit line drives for each data-line (SELB).

As mentioned above, FIG. 9 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 9. Therefore, a selected block is associated with 128 selected bit lines that are connected to 128 local data lines, for which 64 multiplexers choose 64 local data lines to connect to 64 global data lines. The 64 global data lines are connected to 64 sense amplifiers associated with that particular bay. Therefore, at any given time 64 memory cells in a block can be simultaneously programmed. In some embodiments, less than 64 memory cells in a block will be simultaneously programmed to reduce power. The choice of 64 blocks in a bay, 128 bit lines in a column, using 128 local data lines, and 64 global data lines is for one set of embodiments. In other embodiments, different numbers of each item can be used.

Figure 10:
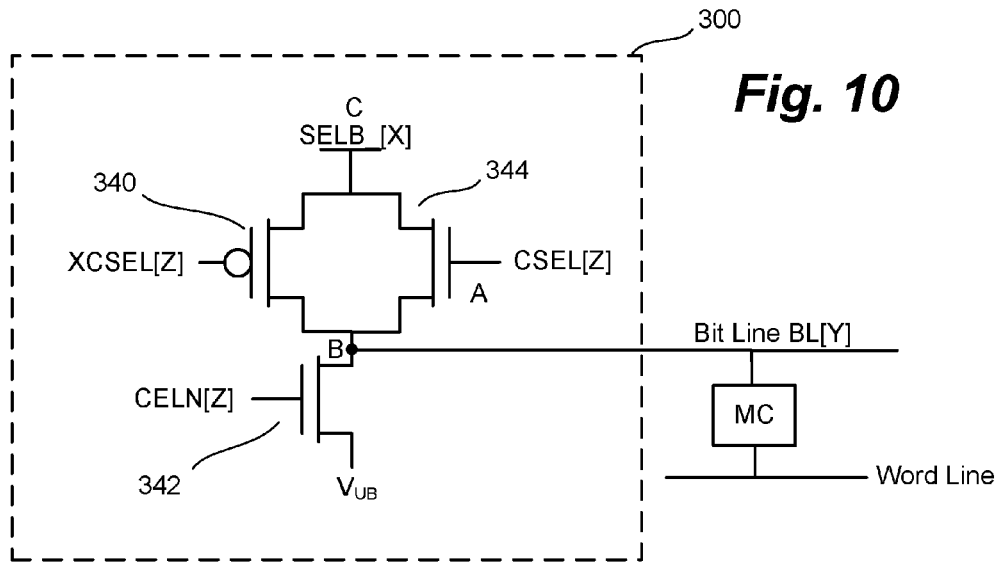
FIG. 10 is a schematic diagram of one embodiment of a selection circuit.

FIG. 10 is a schematic diagram showing the details of one embodiment of selection circuits 300. The selection circuit 300 is connected to one of the local data lines (labeled in FIG. 9 as SELB_[X]) and one of the bit lines. The bit line is connected to one terminal of the memory cell MC. A word line is connected to the other terminal of the memory cell MC. Selection circuit 300 includes p-channel transistor 340 and n-channel transistor 344 both connected to SELB_[X] at node C. Transistor 340 and transistor 344 are also both connected to n-channel transistor 342 at node B. The respective bit line BL[Y] is also connected to node B. Transistor 342 is also connected to VUB (e.g. 0.5 v), the unselected bit line voltage. The gate of transistor 340 is connected to selection signal XCSEL[Z]. The gate of transistor 344 is connected to selection signal CSEL[Z] at node A. Note that XCSEL[Z] is an inverted version of CSEL[Z]. The gate of transistor 342 is connected to CELN[Z]. The signals CSEL[Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z]. CSEL[Z] of FIG. 10 is analogous to CD of FIG. 9.

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL[Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB via the n-channel transistor 342. When transistors 340 and 344 are off and CELN[Z] is 0, then transistor 342 is off and the bit line BL[Y] is floating. This condition is useful for the some embodiments of the capacitance discharge method of programming described herein.

Figure 11:
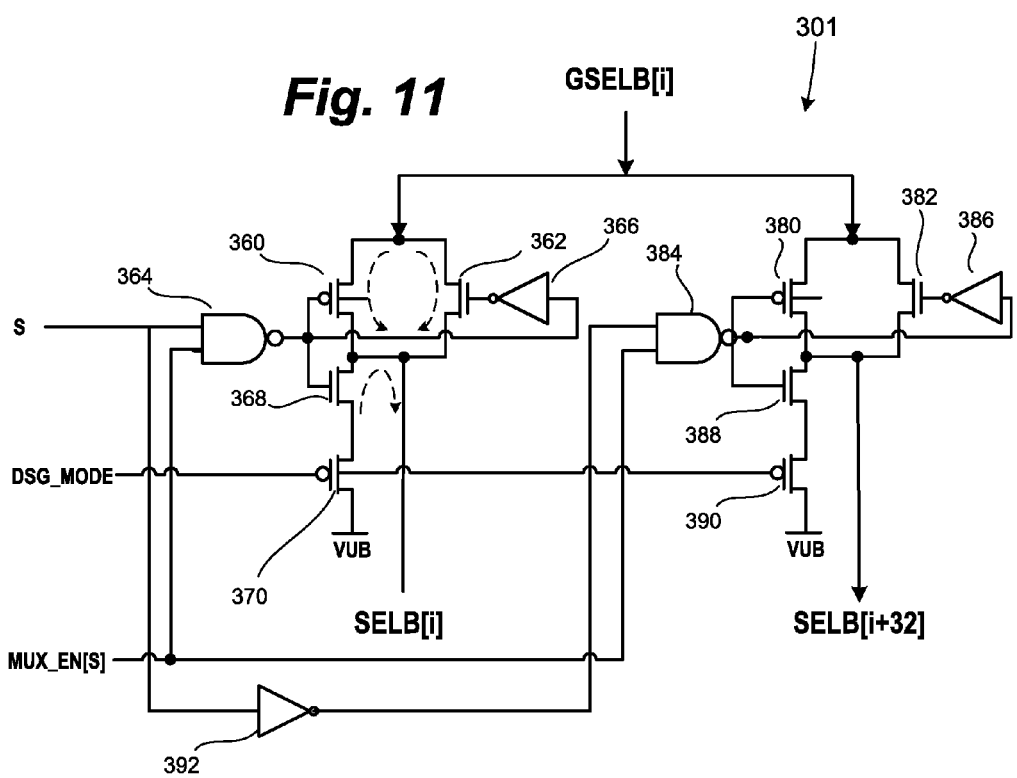
FIG. 11 is a schematic diagram of one embodiment of a multiplexer circuit.

FIG. 11 is a schematic of a circuit for the 2:1 multiplexer (MUX 301) depicted in FIG. 9. The respective global data line GSELB[i] is connected to transistors 360, 362, 380 and 382. Transistors 360 and 362 are also connected to the first of the two local data lines SELB[i]. Thus, transistors 360 and 362 provide a path between the global data line GSELB[i] and the local data line SELB[i] when the transistors are on. In addition to being connected to GSELB[i], transistors 380 and 382 are also connected to the second local data line SELB[i+32]. Thus, transistors 380 and 382 provide a path between global data line GSELB[i] and the second local data line SELB[i+32] when the transistors are on.

The gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 1 when performing one of the possible embodiments of the programming operation using the capacitance discharge mode of programming described herein. By setting signal DSG_MODE to 1, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 390 receives the signal DSG_MODE from system control logic 130. When DSG_MODE is set to 0 and SELB[i] is selected, SELB[i+32] receives VUB via p-channel transistor 390 (in some embodiments). When DSG_MODE is set to 0 SELB[i+32] is selected, SELB[i] receives VUB via p-channel transistor 370 (in some embodiments). The signal DSG_MODE is designed for use with the capacitive discharge method described above. When DSG_MODE is set to 1, SELB[i] can be charged up according to the data pattern. The signal MUX_EN[S] is disabled, and the signals SELB[i] and BL[i] are floating. The selected word line goes low and selected memory cells are programmed.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all 32 global data lines will be used for simultaneous programming. In one embodiment, two different MUX_EN[S] signals each connected to half the multiplexors are used to selectably connect half the GSELB bus to half of the local SELB[i] bus. In this case sixteen bit lines can be selected for simultaneous programming.

The circuits of FIGS. 8-11 can be used to implement the capacitive discharge method of programming discussed above. The circuit of FIG. 10 will be used to connect a column of bit lines to the local data lines SELB[63:0] and the circuit of FIG. 11 is used to connect half of the local data lines SELB[63:0] to the global data lines GSELB[32:0]. Once both connections are made, the thirty two sense amplifiers for side B are in communication with thirty two memory cells via the global data lines, the local data line and the bit lines for each side. During a SET operation, the sense amplifiers will apply a voltage to the global data lines to charge up the global data lines due to the parasitic capacitance of the global data lines. When the multiplexers of FIG. 11 (which are one embodiment of a selection circuit) connect the local data lines to the global data lines, then the local data lines will also be charged up. When the selection circuits of FIG. 10 (which are one embodiment of a selection circuit) connect the local data lines to a set of bit lines, the selected bit lines will also be charged. Once the bit lines are charged, the signals XCSEL[Z] and CSEL [Z] are toggled, which cuts off the bit line and leaves the bit line floating so that over time the bit line will discharge through the memory cell causing the memory cell to SET, as described above. Once the signals XCSEL[Z] and CSEL [Z] are toggled, the word line selection can change so that programming for the next word line will commence.

For many memory arrays, write operations are divided into cycles. Many chip architectures divide write processes into bay address (BAD) cycles so that less than all of the bays are written simultaneously. Each bay may be written separately or multiple bays may be grouped together into a bay group that is written during one bay address (BAD) cycle. For example, if the memory array is divided into sixteen bays and the bays are divided into eight bay groups with two bays in each bay group, there are eight bay addresses for programming the sixteen bays in eight BAD cycles. If each bay is programmed individually, there are sixteen BAD's for programming the sixteen bays in sixteen cycles.

BAD cycles may be divided into column address (CAD) cycles. CAD cycles may be used to reduce power consumption as well as in situations where the number of sense amplifiers is less than the number of bits to be written. In many architectures, the number of sense amplifiers (sense amps) for the memory array is less than the number of bits written during a typical write operation. Consider an example where each bay has 32 blocks and each block includes one sense amplifier and 32 columns. The sense amplifiers in each bay can access each block within the bay. Additionally, the sense amplifiers in each bay can access each block within the same stripe. Nevertheless, the memory capacity of the available sense amplifiers for a write operation is less than the amount of data received for most program commands.

Typical requests to write data to the memory array include a unit or group of data referred to as a page of data. While page sizes may vary by implementation, it is common for a page of data or the page size to be 2048 KB. Because the capacity of the available sense amps to program a page of data is less than 2048 KB, the program or write operation is divided into cycles to sequentially program the page of data in chunks that are less than the total page size. In the above example, the total number of sense amps on the chip is equal to the product of the number of sense amps per bay (32) multiplied by the number of bays (16), or 512 in this example. If the page size for programming is 2048 KB and each sense amp is capable of storing one bit of data, a page of data received with a write request is programmed in 32 different cycles, with each cycle programming 512 bits. These cycles, defined by the quotient of the page size and the total number of sense amps, are typically referred to as column address (CAD) cycles. Thus, each BAD cycle will include multiple CAD cycles. If the BAD cycle includes multiple bays, the CAD cycle typically provides the same CAD to each bay in the bay group to select the CAD spanning the bays of the group.

In addition to BAD cycles and CAD cycles, many memory systems divide the write operation into sense amplifier address (SAD) cycles for power consumption control and other reasons such as program disturb. For example, while every sense amp can be enabled at a given time during write operations, many chip architectures enable less than all of the sense amps at a given time to minimize power consumption and undue voltage drops or currents on chip. In the above example, the 32 sense amplifiers for a bay may be divided into 8 sense amplifier addresses for programming in individual cycles for each column address. In this example, each cycle will program 4 bits in parallel. The architecture may establish that the maximum number of bits that should be programmed in a block is less than the available number of sense amplifiers for the reasons noted above. For example, if a single sense amplifier is enabled at a time for each CAD cycle, there would be 32 sense amplifier addresses and cycles within each CAD cycle. If two sense amplifiers were enabled in each CAD cycle, the number of SAD cycles for each CAD cycle would be 16, etc.

Figure 12:
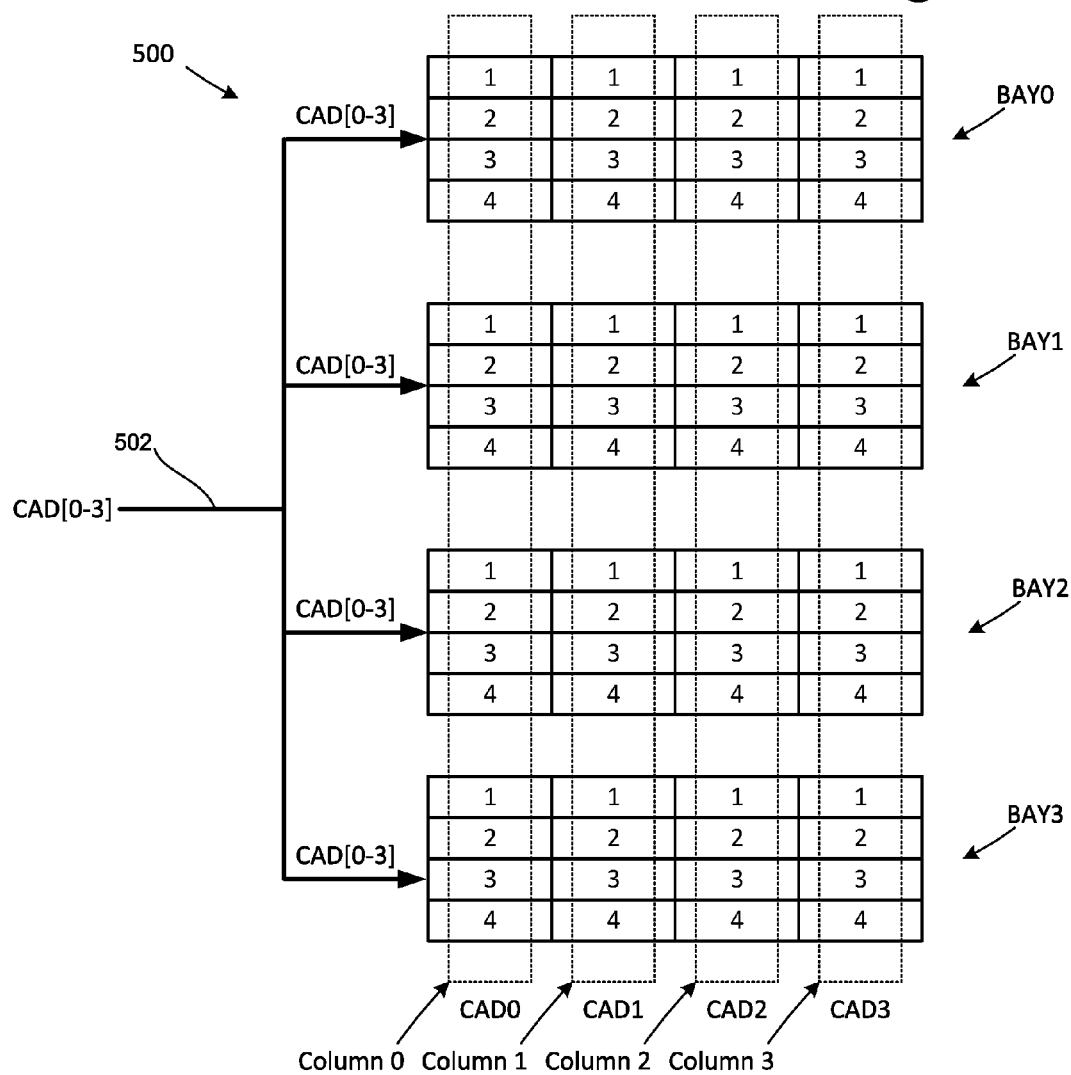
FIG. 12 is a block diagram of a portion of a non-volatile memory array describing a bay and column architecture with common column addressing with a bay group.

FIG. 12 is a simplified block diagram of a portion of a non-volatile memory array illustrating details of a bay and column architecture in one example. FIG. 12 depicts a bay group 500 including bays, Bay 0, Bay 1, Bay 2 and Bay 3. Each bay includes a portion of four columns. Although not shown, a column may include a plurality of bit lines as earlier described. Each column is selected using a column address CAD0, CAD1, CAD2, or CAD3. Each column includes a subset of memory cells at each bay. In this simplified example, each column includes four memory cells at each bay. Memory data can be stored in the bays by distributing a logical page of data across each of the bays. In this particular example, a single physical word line at each bay is depicted having 16 memory cells. The physical word lines at each bay are not connected but may be referred to as a single logical word line because together they store a logical page of data.

FIG. 12 depicts the select line architecture for the different bays in one example. In a typical architecture as shown, a single select line 502 provides the column address from the state machine to the bays of a bay group at the memory array. In FIG. 12 for example the column address signal may select one of Columns 0-3 using column addresses CAD0, CAD1, CAD2 or CAD3. The select line for a bay group routes the column address to each of Bays 0-3. In this manner, the control circuitry is able to select an entire column of memory cells that spans multiple bays using a single column address signal and single column address.

It is possible for memory data that is stored in the memory array to match user data to be programmed to the memory array as part of a write request. For example, a sequential series of bits of the user data to be programmed may match memory data in the memory cells. This may occur during re-writes to program memory cells that were not successfully programmed during an earlier programming iteration of the write process. The memory system may read back a unit of data such as a page after programming and verify that the page matches the data to be programmed. If not all of the data matches (or less than a predetermined number of bits match), then the page will be reprogrammed. Memory data may match user data for other reasons. For example, in an image file it is possible that portions of the image are white and that the appropriate data for the white is already stored as memory data in the corresponding memory cells. When reprogramming the page, it is possible that portions of the data can be skipped because the memory data matches the user data to be programmed.

Some systems permit skipping programming for bay groups when user data matches memory data for a bay group. Programming for a bay group may be skipped when memory data stored in the memory cells of the bay group match the user data for a write operation. Traditionally, a system may analyze each bay of a bay group to determine if the memory data in all of the bays matches the user data. If all of the bays of a group match the user data, the system can skip programming for the bay group during a bay group programming cycle.

Some systems permit skipping programming for a column of memory cells (e.g., a CAD). For column address cycles, traditional skip algorithms generate skip information for a column address, sharing the skip information across the page of data. These systems can determine whether programming for an entire column address across multiple bays can be skipped because the memory data from the column matches the data to be programmed. In one example, while programming data into a first column of memory cells during a write operation, the system evaluates whether programming for a second column of memory cells can be skipped. Other systems evaluate and decide to skip multiple columns of memory cells while programming a prior column of memory cells. These systems may also evaluate whether to skip one or more sense amp addresses for a later column while programming an earlier column. Yet other techniques are able to evaluate during a read before write operation whether multiple columns can be skipped. In these systems, bitmap data may be generated and used to determine whether a column can be skipped during programming. In this manner, the system does not wait on a particular column to be programmed before evaluating other columns.

As depicted in FIG. 12, many systems utilize a common column address signal that can be applied to each of the bays within a bay group. In this manner, the system can provide a single column address to each of the bays within a bay group to select one column from the bay group that spans multiple bays for programming. Where a single column address signal is used to provide one column address to each bay within a bay group, skipping is only permitted for entire columns or column addresses. When each of the subsets of memory cells of the columns in every bay across a bay group matches the user data, programming can be skipped for a column. A single column address is provided to a bay group such that a single column within the bay group can be selected for programming during a column address cycle. Accordingly, the memory data from the memory cells for each subset across all of the bays for a column need to match the user data to be permit a column address cycle to be skipped.

In one embodiment, the system utilizes individual column addressing during a column address cycle to provide different column addresses to different bays within a bay group. The system may first determine whether an entire column of memory cells or single column address can be skipped. If the column address cannot be skipped, the system determines whether any subsets of the column address corresponding to individual bays may be skipped. The system can determine whether each of the bits or memory cells at each bay for a column can be skipped during the next CAD cycle. The system groups multiple column addresses for programming during a single column address cycle at different bays. In this manner, the system programs subsets of memory cells from different column addresses at different bays during the CAD cycle. By grouping column addresses for programming in a common cycle, the system may reduce the overall number of CAD cycles required for programming a bay group. Individual column addressing of the different bays utilizes skip information for each bay.

Figure 13:
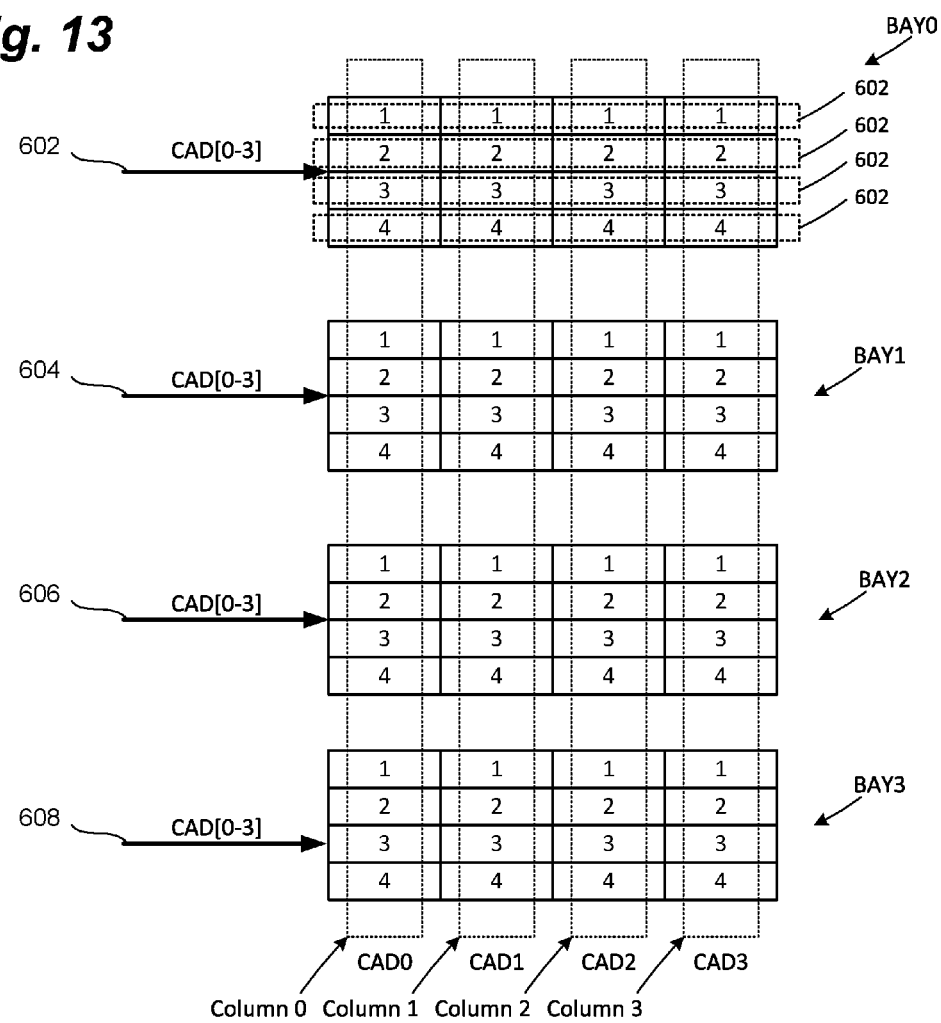
FIG. 13 is a block diagram depicting a bay and column architecture with independent column addressing for different bays.

FIG. 13 depicts a column and bay architecture in one embodiment where individual column addressing is provided for bays of a bay group. The state machine can select individual columns at each bay for programming in one column address cycle. Each bay is provided with an individual CAD select line for receiving an individual column address during a CAD cycle. Bay 0 is in communication with CAD select line 602. Bay 1 is in communication with CAD select line 604. Bay 2 is in communication with CAD Select Line 606. Bay 3 is in communication with CAD select line 608. Individual column address signals can be provided on each of the CAD select lines.

Within each bay of FIG. 13, the memory cells are grouped into sense amplifier (SA) groups 602 for connection to a common set of sense amplifiers for the group. Each sense amplifier group includes a group of memory cells shown as rows with a common notation 1, 2, 3, or 4. In BAY0, a first sense amplifier group includes four memory cells (1), a second sense amplifier group including four memory cells (2), a third sense amplifier group including four memory cells (3), and a fourth sense amplifier group including four memory cells (4). The memory cells within a sense amplifier group 602 connect to individual sets of one or more sense amplifiers through select circuitry that selects an individual one of the memory cells within the group.

In FIG. 13, a bay receives a single column address from the state machine for a column address cycle. The sense amplifier circuitry uses the CAD to select a memory cell from each of the sense amplifier groups for the bay during a column address cycle. Each sense amplifier group within a bay receives the same column address selection during a column address cycle. This permits the sense amplifier circuitry to connect to a common column across the bay.

Figures 14A, 14B:
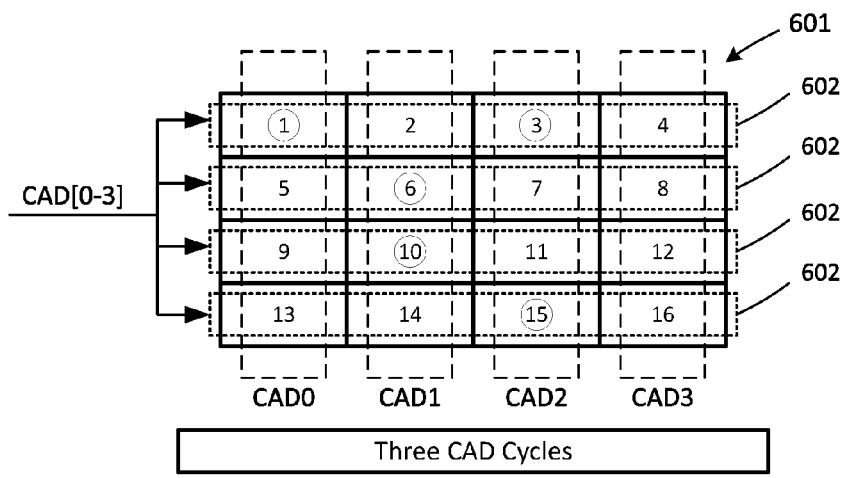

While the technique illustrated in FIG. 13 permits different column addresses to be selected in different bays during a CAD cycle, within each bay a single column is selected. In some cases, this may result in inefficiency, such as where one or more memory cells in a column may be skipped. FIG. 14*a* is a block diagram of a bay, describing an example of a skip analysis to illustrate the use of an individual column addressing for a bay as shown in FIG. 13. In FIG. 14*a*, a single column address is provided to a bay 601 for each column address cycle as shown in FIG. 13. Accordingly, one column address within the bay can be selected during each column address cycle. During each column address cycle, each sense amplifier selects the same column using the same column address CAD.

A particular example is depicted where the system performs a skip evaluation by comparing memory data to user data. The results of the comparison and evaluation are used to determine that for the bay, programming for a subset of the memory cells indicated by a circle should be performed while the remaining memory cells can be skipped. The subset of memory cells for which programming should be performed include memory cell 1 at CAD0 and memory cell 3 at CAD2 for a first sense amplifier group. For a second sense amplifier group, memory cell 6 at CAD1 should be programmed. For a third sense amplifier group, memory cell 10 at CAD1 should be programmed and for sense amplifier group 602, memory cell 15 at CAD2 should be programmed. Accordingly, column addresses CAD0, CAD1, and CAD2 each include at least one memory cell that must be programmed, while CAD3 does not include any memory cells that need to be programmed. As such, programming for column address CAD3 can be skipped.

Three column address cycles are used to program each of column addresses CAD0, CAD1, and CAD2 as shown in FIG. 14*b*. During a first CAD cycle #1, each SA group 602 receives column address CAD0. CAD0 is applied to each sense amplifier group, even though the only bit to be programmed is bit 1 at CAD0. Although programming can be skipped for Bits 5, 9, and 13 at CAD0 in the other SA groups, an entire CAD cycle is used to program bit 1. During a second CAD cycle #2, each SA group 602 receives column address CAD1. CAD1 is applied to each sense amplifier group in order to program bit 6 and bit 10 at CAD1. During a third CAD cycle #3, each SA group 602 receives column address CAD2. CAD2 is applied to each sense amplifier group in order to program bit 3 and bit 15 at CAD2. CAD cycle #4 is skipped because all of the bits for CAD3 match the user data.

Figure 15:
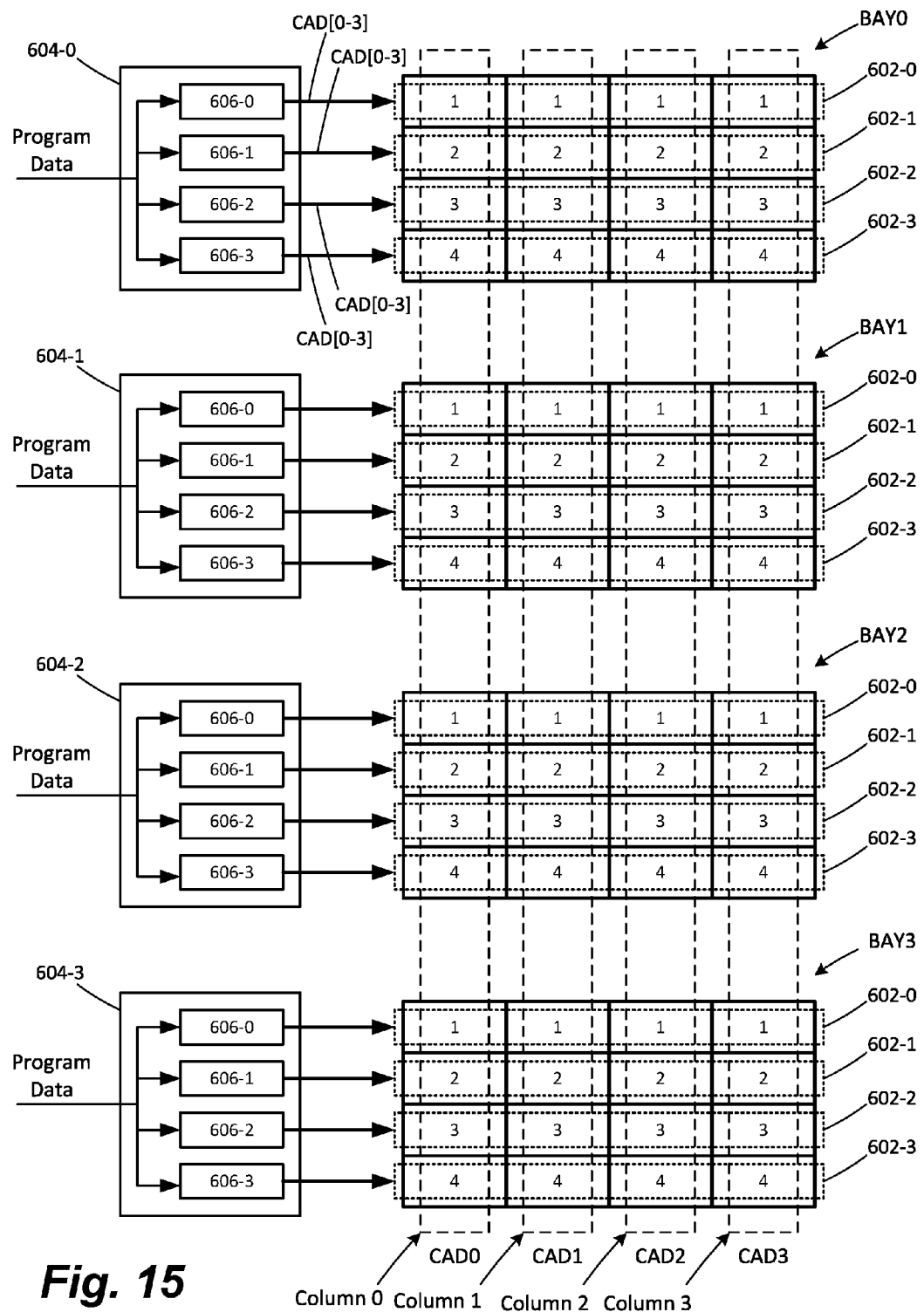
FIG. 15 is a block diagram depicting a bay and column architecture with independent column addressing within a bay for sense amplifier groups.

In accordance with one embodiment, independent addressing of the sense amplifier groups within an individual bay is provided to increase skip efficiency. Individual column addresses are provided to the sense amplifier groups within a single bay to permit the selection of non-volatile memory cells from different columns of a bay for programming in a common CAD cycle. FIG. 15 is a block diagram of a portion of a non-volatile memory array showing individual sense amplifier addressing according to one embodiment of the disclosure. Sense amplifier circuitry is connected to the individual bays of the bay group. Sense amplifier circuitry 604-0 is connected to BAY0, sense amplifier circuitry 604-1 is connected to BAY1, sense amplifier circuitry 604-2 is connected to BAY2, and sense amplifier circuitry 604-3 is connected to BAY3. The memory cells within an individual sense amplifier group all connect to one sense amplifier for the group in FIG. 15, although as described hereinafter some embodiments may include one sense amplifier for each memory cell. In BAY0, group 602-0 connects to sense amplifier 606-0, group 602-1 connects to sense amplifier 606-1, group 602-2 connects to sense amplifier 606-2, and group 602-3 connects to sense amplifier 606-3.

The sense amplifier circuitry at each bay receives program data from the skip analysis indicating the individual bits or memory cells to be programmed during the column address cycle. The sense amplifier circuitry uses the program data to isolate an individual column address CAD for each sense amplifier group within a bay. In this manner, different column addresses may be used for different sense amplifier groups within a bay. This permits different column addresses to be programmed for a single bay during one column address cycle.

FIG. 16*a* depicts the same skip evaluation illustrated in FIG. 14*a*, in an embodiment that provides individual column addresses for each sense amplifier group in a bay 601, in place of a single column address across all sense amplifier groups as shown in FIG. 14*a*. Sense amplifier group 602-0, sense amplifier group 602-1, sense amplifier group 602-2, and sense amplifier group 602-3 are each configured to receive a column address independently of the other sense amplifier groups. During one column address cycle in this manner, a different column can be selected for each sense amplifier group to potentially reduce the total number of column address cycles.

Because of the independent sense amplifier addressing, only two column address cycles are used to program the same data that required three cycles in FIG. 14*a*. Two CAD cycles are needed to program SA group 602-0, one cycle is needed to program SA group 602-1, one cycle is needed to program SA group 602-2, and one cycle is needed to program SA group 602-3. By combining the column addresses for programming as shown in FIG. 16*b*, the three cycles required in FIG. 14*a* can be reduced to two in FIG. 16*b*. During the first CAD cycle, CAD0 is provided to SA group 602-0, CAD1 is provided to SA group 602-1, CAD1 is provided to SA group 602-2, and CAD2 is provided to SA group 602-3. This results in programming of bit 1 at CAD0 from SA group 602-0, bit 6 at CAD1 from SA group 602-1, bit 10 at CAD1 from SA group 602-2, and bit 15 from CAD2 at SA group 602-3. During the second CAD cycle, CAD 2 is provided to SA group 602-0. This results in programming of bit 3 at CAD2 from SA group 602-0.

FIG. 17 is a block diagram describing sense amplifier circuitry 604 for independently assigning column addresses for sense amplifier groups according to one embodiment. FIG. 17 shows the sense amplifier circuitry 604 for a single sense amplifier group 602 within a bay, illustrating that the program data is used to independently assign a column address to the sense amplifier 606. FIG. 17 shows an example including eights bits form eight columns that are addressed using CAD0-CAD7.

Sense amplifier 606 is coupled to a first multiplexer that receives a signal MUX_1. The first multiplexer connects the sense amplifier to a second level of multiplexers when the corresponding sense amplifier group is to be selected during the column address cycle. If the sense amplifier group is not to be selected, the first multiplexer disconnects sense amplifier 606 from the second level multiplexers.

The second level multiplexers include multiplexers 624, 626, 628, and 630. Each multiplexer connects to the first level multiplexer to provide selective connection to sense amplifier 606. Multiplexer 624 receives a select signal MUX_2A, multiplexer 626 receives a select signal MUX_2B, multiplexer 628 receives a select signal MUX_2C, and multiplexer 630 receives a select signal MUX_2D. Select signals MUX_1, MUX_2A, MUX_2B, MUX_2C, and MUX_2D are generated from the program data to connect SA 606 to a memory cell from any of the columns in the bay, independently of the connection for the other sense amplifier groups during the same column address cycle. MUX_2A is used to select column 1 using CAD0 or column 2 using CAD1. MUX_2B is used to select column 3 using CAD2 or column 4 using CAD3. MUX_2C is used to select column 5 using CAD4 or column 6 using CAD5. MUX_2D is used to select column 7 using CAD6 or column 8 using CAD7.

Figure 18:
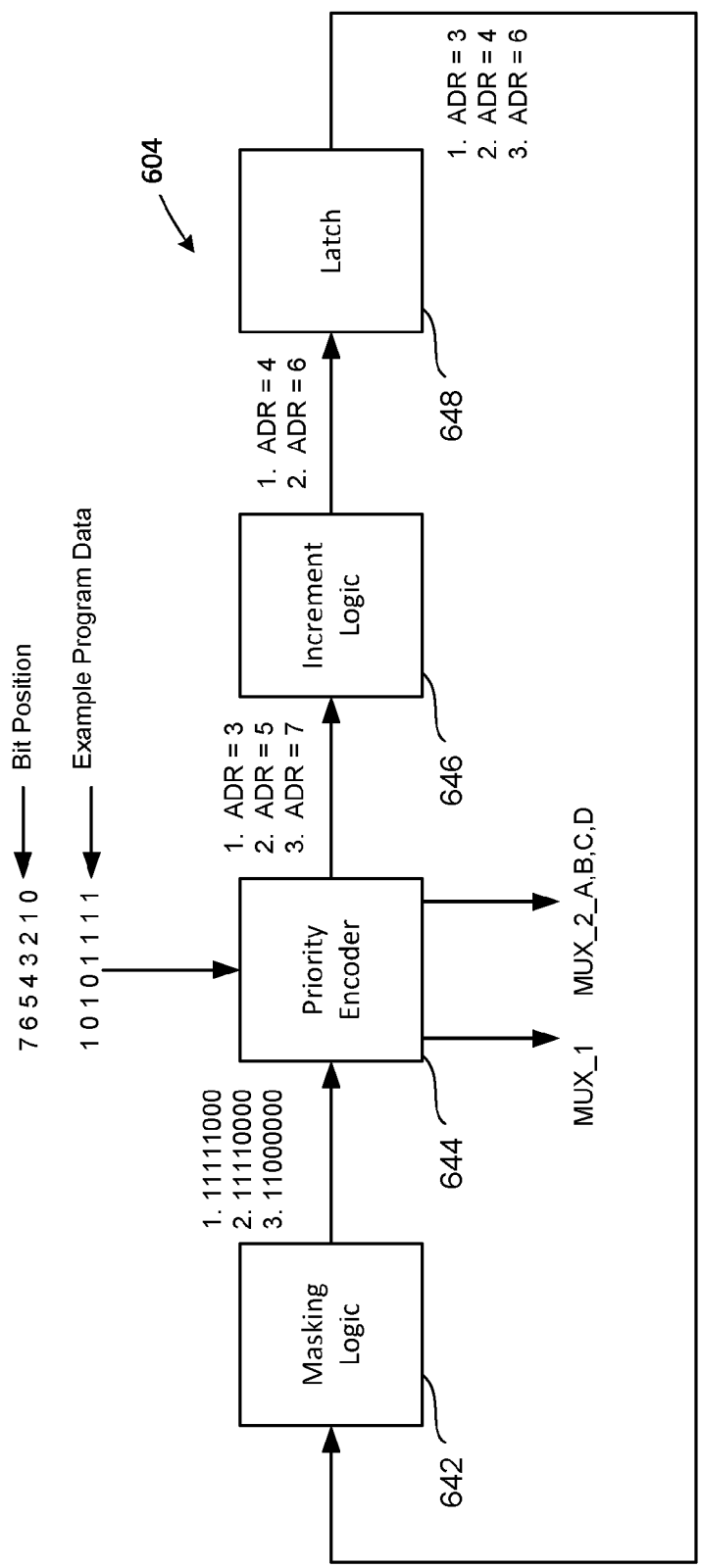
FIG. 18 is a simplified block diagram showing priority encoder circuitry for generating select signals for independently assigning column addresses to a sense amplifier within a bay.

FIG. 18 is a block diagram according to one embodiment describing a portion of sense amplifier circuitry 604 that generates multiplexer select signals, such as select signals MUX_1, MUX_2A, MUX_2B, MUX_2C, and MUX_2D to select an individual column for a sense amplifier group using program data. The select circuitry iteratively processes the program data to indicate the next bit for programming in the sense amplifier group using priority encoding. The select signal generation circuitry includes masking logic 642 that generates a bit stream indicating which bits remain to be analyzed. Priority encoder 644 receives the program data as a first input. The program data may be generated from a skip analysis to indicate which bits need to be programmed. An example is shown using 8 bits of program data having bit positions indicated as 0-7. Eight bits of program data may be used to generate a first level multiplexer select signal MUX_1, and second level multiplexer select signals MUX_2A, MUX_2B, MUX_2C, and MUX_2D. Eight bits of program data may be used, for example, to control selection of eight columns and using eight column addresses independently for the sense amplifier group. The priority encoder analyzes the current bit of program data indicated by the bit stream received from the masking logic. The priority encoder determines if the bit of program data indicated by the masking logic should be programmed. Select signals MUX_1 and MUX_2_A,B,C,D are generated to select the next bit for programming during the next column address cycle. Increment logic 646 receives an address generated by priority encoder and increments the current address by one to generate an address that is latched by latch 648.

A specific example is described using an example of program data '10101111.' A logic '0' indicates a bit that can be skipped, while a logic '1' indicates a bit that should be programmed. In the example, a first iteration (1) is shown after the circuit has completed analysis of bit positions 0, 1, and 2. After analyzing the first three bits, the latch outputs address 3 indicating that bit position 2 has been analyzed and bit position 3 should now be analyzed. Masking logic 642 generates a bit stream having logic '0' for bit positions 0-2 and logic '1' for bit positions 3-7. Priority encoder receives the bit stream which indicates that bit position 3 should be analyzed. Priority encoder 644 analyzes bit position 3 of the program data. In this case, bit position 3 is logic '1' indicating that bit position 3 needs to be programmed. The priority encoder 644 generates MUX_1 and MUX_2_A,B, C, and D signals to select the column for bit position 3 during the next column address cycle. Priority encoder 644 passes address 3 to increment logic 706. Logic 646 increases address 3 to address 4 and passes address 4 to latch 648. Latch 648 holds the current address.

Latch 648 outputs address 4 to begin the second iteration (2). During the second iteration, masking logic 642 outputs 11110000 indicating that bit position 4 should be analyzed. Priority encoder 644 analyzes bit position 4 which includes logic '0' indicating that bit position 4 can be skipped in the next column address cycle. Priority encoder then analyzes bit position 5 and determines that it needs to be programmed. The priority encoder 704 generates MUX_1 and MUX_2_A,B,C, and D signals to select the column for bit position 5 during the next column address cycle. Priority encoder 644 passes address 5 to increment logic 646. Logic 646 increases address 5 to address 6 and passes address 6 to latch 648.

Latch 648 outputs address 6 to begin the third iteration (3). During the third iteration, masking logic 642 outputs 11000000 indicating that bit position 6 should be analyzed. Priority encoder analyzes bit position 6 which includes logic '0' indicating that bit position 6 can be skipped in the next column address cycle. Priority encoder then analyzes bit position 7 and determines that it needs to be programmed. The priority encoder 644 generates MUX_1 and MUX_2_A, B,C, and D signals to select the column for bit position 7 during the next column address cycle. Priority encoder 644 passes address 7 to increment logic 646. Logic 646 terminates the process for the SA group after receiving the final bit position 7.

With independent sense amp addressing as described in FIG. 14, each sense amplifier group 602 may be assigned a quota to limit the number of bits that are programmed in parallel for a bay during a column address cycle. This may be done to limit the voltage drop in the array due to resistance across the word line. By way of example with reference to FIG. 14, a quota of 1 may be used for each sense amplifier group during a column address cycle. By providing a quota of 1, the maximum number of bits that will be programmed during a CAD cycle is four, equal to the sum of the quota for each SA group.

Figures 19A, 19B:
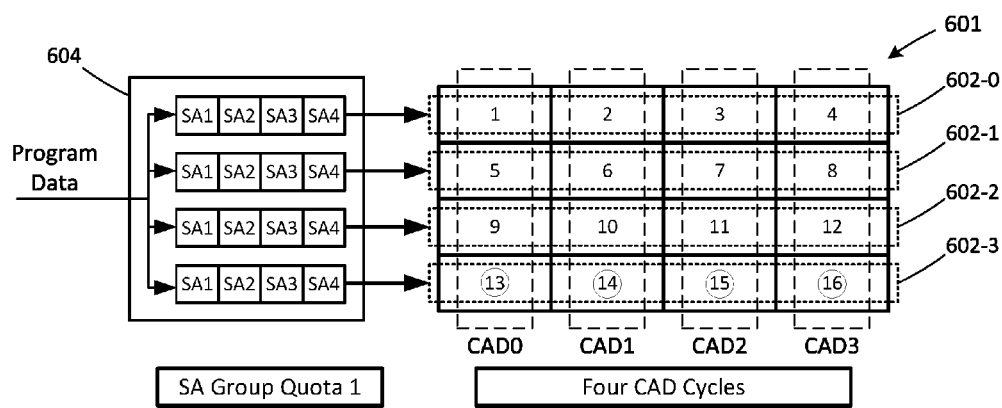

FIG. 19a is a block diagram of a bay, describing an example of a skip analysis after comparing memory data to user data that illustrates the use of a quota when programming SA groups 602-0, 602-1, 602-2, and 602-3. The results of the comparison and evaluation are used to determine that for the bay 601, programming the subset of memory cells indicated by the circle should be performed while the remaining memory cells may be skipped. In this example, the system determines for sense amplifier group 602-0, that the memory cells for all columns can be skipped. Similarly, the system determines for sense amplifier groups 602-1 and 602-2, that the memory cells for all columns CAD0-CAD3 can be skipped. The system determines that for sense amplifier group 602-3 that the memory cells at each column CAD0-CAD3 need to be programmed.

Using a quota of one for each sense amplifier group in this example may lead to inefficiencies in programming. A total of four CAD cycles will be used to program bay BAY0, even though 12 of the 16 memory cells will be skipped during the bay cycle. If the system limits programming based on the sense amplifier group quota, four cycles will be used because all four bits of one sense amplifier group need to be programmed as illustrated in FIG. 19b. During CAD cycle #1, column address CAD0 is provided to the fourth SA group 602-3 to program bit 13 while programming at all other SA groups is skipped. During CAD cycle #2, column address CAD1 is provided to the fourth SA group 602-3 to program bit 14 while programming at all other SA groups is skipped. During CAD cycle #3, column address CAD2 is provided to the fourth SA group 602-3 to program bit 14 while programming at all other SA groups is skipped. During CAD cycle #4, column address CAD3 is provided to the fourth SA group 602-3 to program bit 16 while programming at all other SA groups is skipped.

With an SA group quota of one, a total of four memory cells may be programmed during a single CAD cycle. For example, the system may program all four bits of a column by programming one bit from each SA group for the column. In accordance with one embodiment, a bay quota is utilized and shared across the SA groups of a bay to control and limit programming to a maximum number of parallel bits across a bay where individual sense amplifier addressing is used. The bay quota represents the maximum number of bits that may be programmed in parallel for the bay across all SA groups. By sharing the bay quota across SA groups, multiple memory cells from a single SA group may be programmed in a single CAD cycle when one or more memory cells from another SA group of a common bay can be skipped.

Figures 20A, 20B:
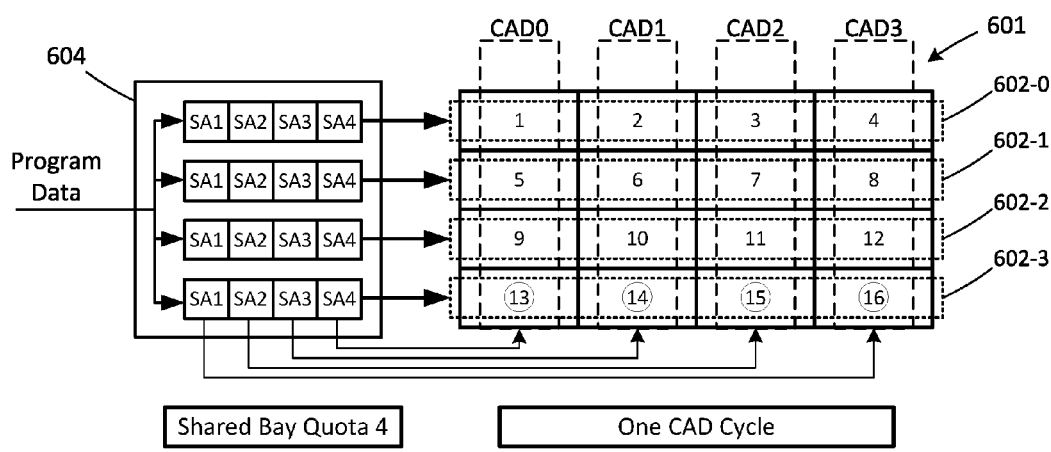

Referring to FIG. 20a, one embodiment provides a sense amplifier for each memory cell of a bay. For example, sixteen sense amplifiers may be included in FIG. 20a for BAY0, with each SA group including four sense amplifiers SA1-SA4 as depicted. In this configuration, the quota for the SA groups may be shared across the bay so that the four non-skippable memory cells may be programmed in a single CAD cycle. The system determines that all the memory cells from SA groups 602-0, 602-1, and 602-2 can be skipped, while four memory cells from SA group 602-3 need to be programmed as described in FIG. 19a. The system compares the number of memory cells to be programmed with the shared bay quota. In FIG. 20a, an example of four is chosen to maintain the same number of parallel programming bits in the bay as when a non-shared SA group quota of one is used. The system determines that the number of memory cells that need to be programmed is equal to the bay quota. In response, the system generates four column addresses to simultaneously select each of the memory cells of the fourth SA group 602-3 during a single CAD cycle. A first sense amplifier SA1 in the SA group connects to CAD0, a second sense amplifier SA2 in the SA group connects to CAD1, a third sense amplifier SA3 in the SA group connects to CAD2, and a fourth sense amplifier SA4 in the SA group connects to CAD3. During a single CAD cycle as shown in FIG. 20b, each of the bits in SA group 602-3 are programmed while maintaining the overall bay quota. SA1 is used to program bit 13 in CAD0, SA2 is used to program bit 14 in CAD1, SA3 is used to program bit 15 in CAD2, and SA4 is used to program bit 16 in CAD3.

In another embodiment, one sense amplifier may be used for an SA group while still sharing the SA group quota across the bay. The sense amplifiers for a bay may be configured so that any sense amp can access any memory cell within the bay, over the different sense amp groups. In this manner, the bay quota may be shared across the SA groups so that the four non-skippable memory cells in FIG. 20a may be programmed in a single CAD cycle. For example, the sense amplifier from group 602-0 may be used to program bit 13, the sense amplifier from group 602-1 may be used to program bit 14, the sense amplifier from group 602-2 may be used to program bit 15, and the sense amplifier from group 602-3 may be used to program bit 16.

Figure 21:
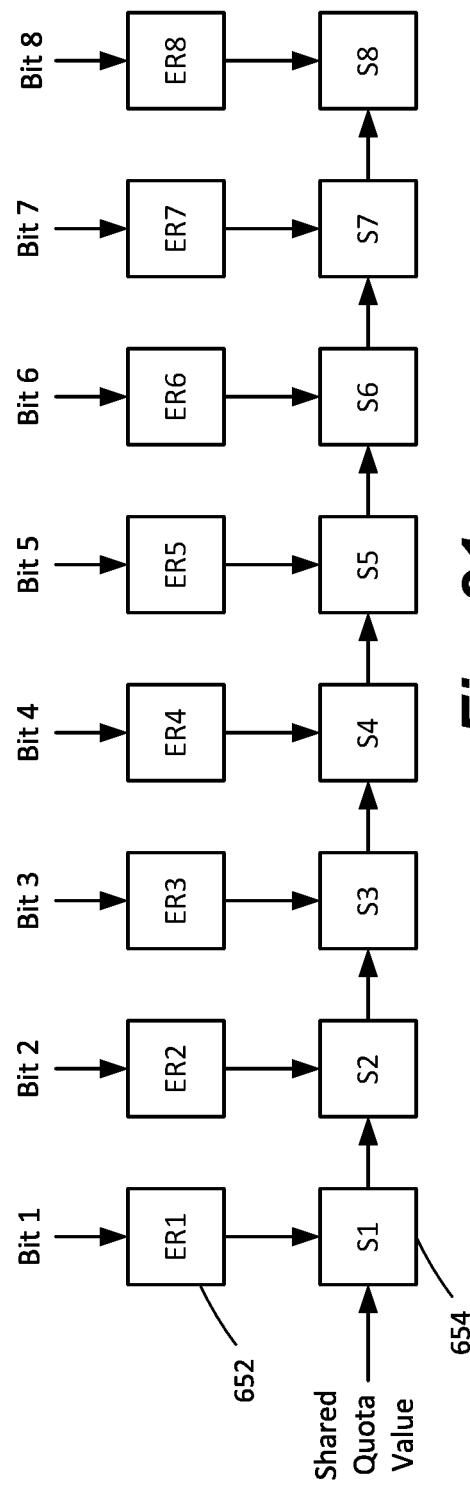
FIG. 21 is a simplified block diagram showing circuitry for selecting column addresses within a bay for programming using a shared quota of parallel programming bits within the bay.

FIG. 21 is a simplified block diagram of a circuit that may be used to apply a quota to a bay of non-volatile storage elements using individual sense amplifier addressing. A series of error registers 652 store the program data for each of the bits along the word line at the bay. The error registers hold a logical value indicating whether the corresponding memory cell should be programmed (e.g., logic '1') or skipped (e.g., logic '0'). The value of the error register for each bit is passed to a subtractor 654. A first subtractor (S1) receives the shared quota value for the bay. Subtractor S1 determines if error register ER1 indicates that Bit 1 should be programmed. If bit 1 should be programmed, the subtractor decreases the shared quota value (by one for example). The first subtractor S1 provides the original quota value or the decreased value to the second subtractor. The second subtractor performs the same process using the value of the second error register ER2 for bit 2. This process is then repeated through the chain of error registers and subtractors to select the maximum number of bits for programming at the word line for the bay.

A memory cell's distance along the word line relative to the word line driver affects the amount of voltage drop across the memory cell due to resistance in the word line. The further a memory cell is from the word line driver, the larger the amount of voltage drop there will be when programming during a column address cycle. Because of the different amounts of voltage drop, memory cells may be configured into columns based on their position along the word line in order to normalize the amount of voltage drop during each CAD cycle.

Figure 22:
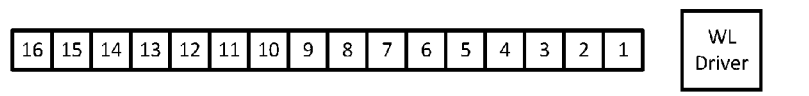
FIG. 22 is a simplified block diagram of a word line showing the distance from a word line driver for each non-volatile storage element.

FIG. 22 is a block diagram showing a word line in a bay that includes 16 memory cells. Memory cell 1 is adjacent to the word line driver. The memory cells are numbered according to their position relative to the word line driver to represent a weighted voltage drop associated with each memory cell. Increasing numbers represent a further distance from the word line driver and thus, a larger weight. The voltage drop across memory cell 1, closest to the WL driver is less than the voltage drop across memory cell 2, and the voltage drop across memory cell 3 is less than the voltage drop across memory cell 2, and so on. Accordingly, the numbers represent a relative amount of voltage drop that is observed across the different memory cells.

Figure 23:
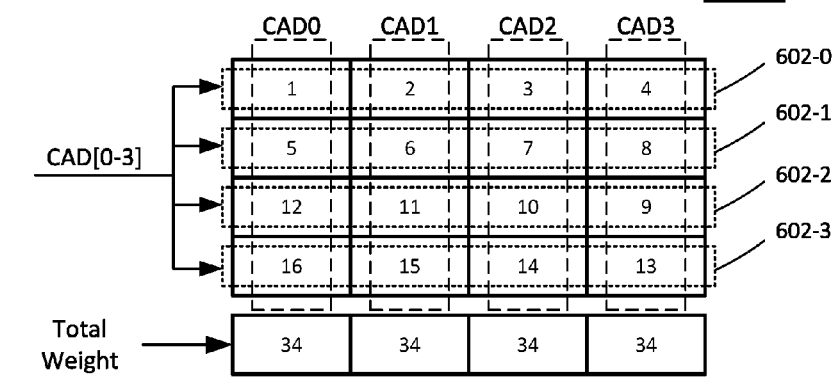
FIG. 23 is a block diagram depicting a bay and an organization of non-volatile storage elements to normalize a voltage drop across different columns of the bay during programming with a common column address for the bay.

FIG. 23 is a block diagram of a bay depicting a representative organization of the memory cells along a word line to normalize the voltage drop across the memory cells during each CAD cycle. In FIG. 23, the first column addressed by CAD0 includes memory cells 1, 5, 12, and 16. The second column addressed by CAD1 includes memory cells 2, 6, 11, and 15. The third column addressed by CAD2 includes memory cells 3, 7, 10, and 14. The fourth column addressed by CAD3 includes memory cells 4, 8, 9, 13. If the weights for each memory cell are summed, the total weight for each column is 34. By this organization, the voltage drop experienced by each column is the same when programming all memory cells of the column. FIG. 23 depicts a bay addressing technique where a single column address is shared across the bay for all sense amplifier groups. In such a technique, each SA group selects the same CAD such that programming is restricted to a single column. In this manner, the maximum voltage drop will be consistent as the different column addresses are programmed.

Figure 24:
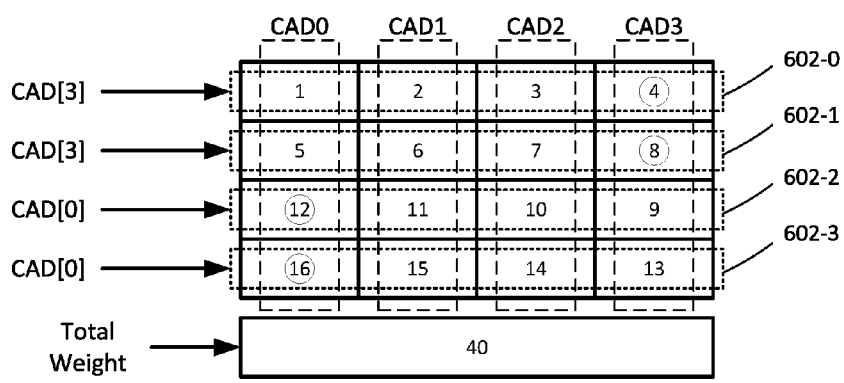
FIG. 24 is a block diagram depicting a bay and an organization of non-volatile storage elements illustrating a potential voltage drop resulting from independent column addressing for sense amplifier groups within the bay.

FIG. 24 is a block diagram of a bay depicting the organization of the memory cells from FIG. 23. In FIG. 24, an individual sense amplifier addressing technique is illustrated. Each sense amplifier group may be assigned an individual column address to individually select memory cells within the bay for programming. A specific example of the results of a skip analysis is illustrated where bits 4, 8, 12, and 16 need to be programmed, while the remaining bits may be skipped. Because individual SA addressing is used, the bits may be simultaneously programmed by selecting column address CAD3 at SA groups 602-0 and 602-1 and selecting column address CAD0 at SA groups 602-2 and 602-3. If these four bits are simultaneously programmed in one column address cycle, a larger voltage drop can be expected when compared with the voltage drop that may occur from programming four memory cells using one column address as shown in FIG. 23. The combined weight of the bits or total weight when programming these bits in parallel is 40. The maximum voltage drop across the WL for programming four bits in this technique is 4*Current*40*R. In FIG. 24, the expected increase in resistance is given by the formal s*R/2, where s is equal to the number of bits that are allowed to be programmed in parallel (e.g., four) and R is equal to the resistance of the word line.

Figure 25:
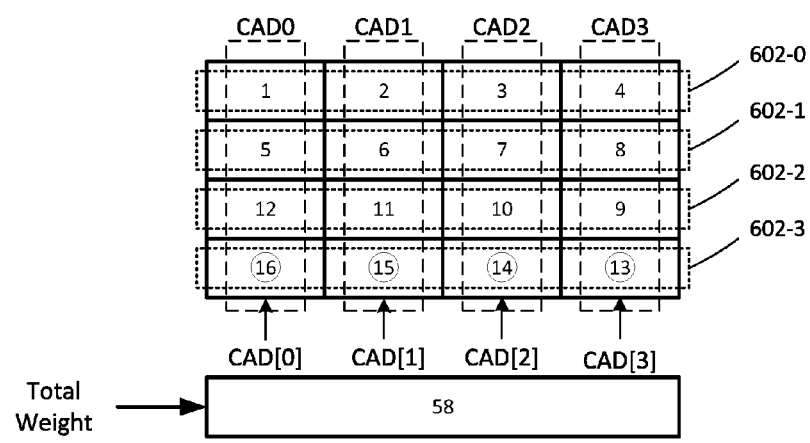
FIG. 25 is a block diagram depicting a bay and an organization of non-volatile storage elements illustrating a potential voltage drop resulting from shared quota programming.

FIG. 25 is a block diagram of a bay depicting the organization of the memory cells from FIG. 23. In FIG. 25, an individual sense amplifier addressing technique is illustrated along with bay quota sharing. A bay quota is shared across SA groups and each memory cell within a SA group may be programmed in parallel, either by providing a sense amplifier for each cell or sharing sense amplifiers across SA groups. A specific example of the results of a skip analysis is illustrated where bits 16, 15, 14, and 13 need to be programmed, while the remaining bits may be skipped. Because quota sharing is used, these bits may be simultaneously programmed by selecting at SA group 602-3, column address CAD0 for bit 16, CAD1 for bit 15, CAD2 for bit 14, and CAD3 for bit 13. If these four bits are simultaneously programmed in one column address cycle, a larger voltage drop can be expected when compared with the voltage drop that may occur from programming four memory cells using one column address as shown in FIG. 23 and FIG. 24. The combined weight of the bits or total weight when programming these bits in parallel is 54. Accordingly, the maximum voltage drop across the WL for programming four bits in this technique is 4*Current*54*R. In FIG. 25, the expected resistance will increase over the value given by $S*R/2$ in FIG. 24. The total resistance in FIG. 25 is given by $(S*R/2)*(1+[(N-S)/(N-S)]*(1/p))$. N is equal to the number of bits in the word line and p is equal to the number of boundaries between the sense amplifier groups. For example, there are four boundaries in FIG. 24 where each sense amplifier group is restricted to receiving one column address during a cycle and only one boundary in FIG. 25 where each sense amplifier group may receive four column addresses.

To account for differences in voltage drop because of a memory cell's position, and an increase that may occur from sharing a bay quota across SA groups, a weighted quota sharing technique is used in one embodiment. A quota is shared across the SA groups as earlier described, but the value of the quota is weighted according to the position of the memory cell's that are being programmed. In one example, the word line within a bay is divided into zones based on the distance of memory cells from the word line driver. A different quota is used for programming memory cells in the different zones. For example, the number of memory cells programmed in a first zone may be compared with an initial quota. If the number of memory cells is less than the initial quota, the remainder of the quota may be decreased before selecting additional memory cells in the second zone that can be programmed in parallel with the cells from the first zone. In this manner, the quota is weighted so that fewer memory cells from the second zone are selected for simultaneous programming when compared with the number of memory cells in the first zone.

Figure 26:
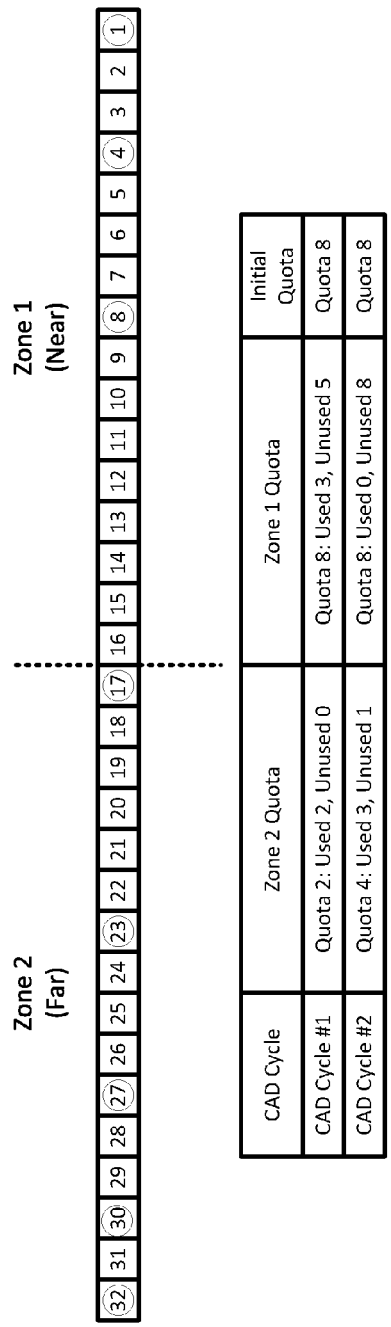
FIG. 26 is a block diagram of a word line and a table illustrating a weighted quota sharing technique according to one embodiment.

FIG. 26 is a block diagram showing a word line in a bay that includes 16 memory cells. Memory cell 1 is adjacent to the word line driver and the memory cells are numbered according to their position relative to the word line driver to represent a weighted voltage drop associated with each memory cell. The memory cells of the word line have been divided into two zones. Zone 1 is nearer to the WL driver than Zone 2. Zone 1 includes memory cells 1-16 and zone 2 includes memory cells 17-32.

An example of a skip analysis is shown by the circles, where it is determined that memory cells 1, 4, 8, 17, 12, 17, 30 and 32 should be programmed, and the remaining memory cells can be skipped. The table at the lower portion of FIG. 26 illustrates application of the weighted quota for the bay so that the eight memory cells are programmed in 2 cycles. An initial bay quota of 8 is used, representing a maximum number of parallel programming bits that may be used if all of the memory cells to be programmed are in Zone 1. The number of bits to be programmed in Zone 1 is three. Accordingly, 3 of the allotted 8 parallel programming bits in the quota are used, leaving 5 available programming bits under the quota. This remainder typically may be applied to select the other five bits that need to be programmed. A weighted quota, however, is applied so that the maximum voltage drop across the word line can be maintained when quota sharing is utilized. In this example, the remainder of the quota after selecting the bits from Zone 1 is reduced before selecting bits for programming from Zone 2. In this specific example, the remainder is divided by 2 before being passed to Zone 2. Accordingly, the remainder of 5 is halved, and rounded down to the nearest whole number of 2. Thus, a second quota value of 2 is used when selecting bits for programming in Zone 2. In this manner, the system selects bits 17 and 23 for programming with bits 1, 4, and 8 during a first programming cycle. A second CAD cycle will then be used to program the remaining bits. The initial quota is again applied to Zone 1 where no bits need to be programmed. Thus, the remainder of the initial quota in Zone 1 from the second CAD cycle is 8. The remainder is reduced by half so that a quota of 4 is passed to Zone 2. Bits 27, 30, and 32 remain to be programmed in Zone 2. Thus, the system uses 3 of the available four from the quota to select these three bits for programming during the second CAD cycle #2.

Figure 27:
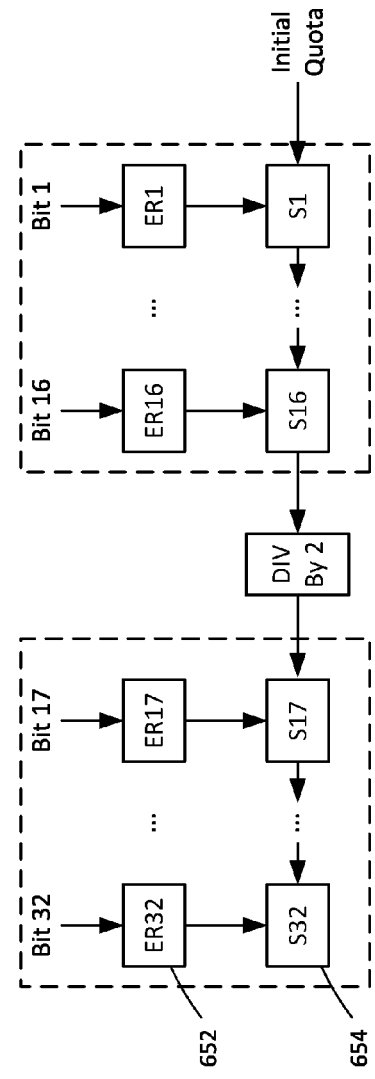
FIG. 27 is a simplified block diagram showing circuitry for selecting column addresses within a bay for programming using a weighted shared quota of parallel programming bits within the bay based on distance from a word line driver.

FIG. 27 is a block diagram of a portion of sense amplifier circuitry 604 that may be used to apply a weighted quota across different zones of a word line to normalize and control the voltage drop when a quota sharing technique is applied. A series of error registers 652 and subtractors are divided into zones corresponding with the example of FIG. 26. The error registers store the program data for each of the bits along the word line at the bay as earlier described, holding a logical value indicating whether the corresponding memory cell should be programmed or skipped. The value of the error register for each bit is passed to a subtractor 654.

A first subtractor (S1) in the first zone receives the initial quota value for the bay. Subtractor S1 subtracts one from the initial quota value if bit 1 needs to be programmed. S1 passes the subtracted value or the initial quota value to the second error register for bit 2. This process is repeated as earlier described through all of the error registers in zone 1. After subtraction by the last subtractor for the zone, the remainder of the initial quota value is passed to a divider. The divider in this example divides the remainder by 2 to generate a second quota value that is passed to a first subtractor for bit 17, the first bit of the second zone. The circuit in the second zone repeats the process from the first zone, beginning with the second quota value. In this manner, the second zone is allotted a weighted quota value to reduce the number of parallel programming bits in Zone 2, when compared to Zone 1. As FIG. 27 illustrates, where an initial quota of 8 is used, the maximum number of parallel programming bits in Zone 2 is 4. That is, if not bits are to be programmed from Zone 1, the total initial quota is divided in half and passed to Zone 2 as a value of 4.

Although an equal division of memory cells into zones is described in FIG. 27, this is not required. Moreover, the word line may be divided into any number of zones. Between zones, the remainder of the quota from the second zone may be further reduced before passing to the third zone, etc. Continuing with an example of an initial quota of 8, the 32 bit example of FIGS. 26 and 27 may be divided into four zones of 8. The remainder of the initial quota can be divided after Zone 1, for selecting memory cells from Zone 2, then the remainder from Zone 2 can be divided for selecting memory cells from Zone 3, then the remainder from Zone 3 divided for selecting memory cells from Zone 4. In this manner, the maximum number of cells that may be programmed in Zone 1 is 8, the maximum number that may be programmed in Zone 2 is 4, the maximum number that may be programmed in Zone 3 is 2, and the maximum number that may be programmed in Zone 4 is 1.

There has thus been described a method of programming non-volatile storage that includes providing a bay of non-volatile storage elements that is configured for programming in a plurality of column address cycles, providing a first sense amplifier circuit in communication with a first group of non-volatile storage elements of the bay where each non-volatile storage element of the first group is programmed using a different column address, and providing a second sense amplifier circuit in communication with a second group of non-volatile storage elements of the bay where each non-volatile storage element of the second group is programmed using a different column address. The method includes selecting for programming in a first column address cycle by the first sense amplifier circuit a first column for the first group of the bay, and selecting for programming in the first column address cycle by the second sense amplifier circuit a second column for the second group of the bay.

A non-volatile memory system has been described that includes a bay of non-volatile storage elements configured for programming in a plurality of column address cycles. The bay includes a first group of non-volatile storage elements associated with a plurality of columns and a second group of non-volatile storage elements associated with the plurality of columns. The system includes a first sense amplifier circuit associated with the first group of non-volatile storage elements of the bay. The first sense amplifier circuit is configured to program in a first column address cycle a second non-volatile storage element of the first group having a second column address in response to determining that the second non-volatiles storage element should be programmed and a first non-volatile storage element of the first group having a first column address can be skipped. The system includes a second sense amplifier circuit associated with a second group of non-volatile storage elements of the bay. The second sense amplifier circuit is configured to program in the first column address cycle a first non-volatile storage element of the second group having the first column address in response to determining that the first non-volatile storage element of the second group should be programmed.

A method of programming non-volatile memory has been described that includes providing a bay of non-volatile storage elements that are configured for programming in a plurality of column address cycles associated with a plurality of column addresses. The bay includes a shared quota of programmable bits in one column address cycle. The method includes determining whether programming can be skipped for each non-volatile storage element associated with each column address of the bay. In response to determining that programming can be skipped for at least one non-volatile storage element of a first column address, the method includes determining a second column address in the bay having at least one non-volatile storage element that needs to be programmed and determining whether programming of the at least one non-volatile storage element of the second column address during a first column address cycle with the first column address would exceed the shared quota of programmable bits for the bay. If programming the at least one non-volatile storage element of the second column address would not exceed the shared quota of programmable bits, the method includes programming the first column address and the second column address at the bay during the first column address cycle.

A non-volatile memory system has been described that includes a non-volatile memory array including a bay of non-volatile storage elements that are configured for programming in a plurality of column address cycles associated with a plurality of column addresses, a set of error registers configured to store program data representing skippable and programmable non-volatile storage elements of the bay, and one or more control circuits in communication with the non-volatile memory array and the set of error registers. The one or more control circuits are configured to determine a second column address having at least one non-volatile storage element that is programmable in response to the program data indicating that at least one non-volatile storage element of a first column address is skippable. The one or more control circuits are configured to determine whether programming the at least one non-volatile storage element of the second column address during a first column address cycle with the first column address would exceed a shared quota of programmable bits for the bay and if programming the at least one non-volatile storage element of the second column address would not exceed the shared quota of programmable bits, program the first column address and the second column address at the bay during the first column address cycle.

A method of programming non-volatile storage has been described that includes providing a bay of non-volatile storage elements that are configured for programming in a plurality of column address cycles associated with a plurality of column addresses. The bay includes a word line of non-volatile storage elements formed in sequence with an increasing distance from a word line driver. If a number of programmable bits in a first zone of the word line nearest the word line driver is less than or equal to a first quota, the method includes determining a second quota by decreasing a value equal to a difference between the number of programmable bits and the first quota and comparing a number of programmable bits in a second zone of the word line to the second quota. If the number of programmable bits in the second zone is equal to or less than the second quota, the method includes programming the number of programmable bits in the first zone and the number of programmable bits in the second zone during a first column address cycle.

A non-volatile memory system in one embodiment includes a bay of non-volatile storage elements that are configured for programming in a plurality of column address cycles associated with a plurality of column addresses. The bay including a first word line of non-volatile storage elements. The system includes a first set of error register circuits associated with a first subset of the non-volatile storage elements of the first word line that are in a first zone nearest to the word line driver. The first set of error register circuits are configured to subtract from a first quota a number of programmable bits in the first zone to generate a remainder quota. The system includes a divider circuit configured to generate a second quota based on decreasing the remainder quota and a second set of error register circuits associated with a second subset of the non-volatile storage elements of the first word line that are in a second zone further from the word line driver. The second set of error register circuits are configured to subtract from the second quota a number of programmable bits in the second zone.

A method of programming non-volatile storage in one embodiment includes providing a bay of non-volatile storage elements that are configured for programming in a plurality of column address cycles associated with a plurality of column addresses. The bay includes a word line of non-volatile storage elements formed in sequence with an increasing distance form a word line driver. The method includes programming the bay of non-volatile storage elements by combining a first column address and a second column address into a first column address cycle. Programming includes providing a first quota for a maximum number of programmable bits in a first zone of the word line nearest the word line driver and a second quota for a maximum number of programmable bits in a second zone of the word line further from the word line driver than the first zone.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
a bay of non-volatile storage elements including a first group of non-volatile storage elements associated with a plurality of columns of the bay; and
a first circuit associated with the first group and configured to conditionally program in a first column address cycle a second non-volatile storage element of the first group having a second column address based on determining that the second non-volatile storage element should be programmed and a first non-volatile storage element of the first group having a first column address can be skipped.

2. The apparatus of claim 1, wherein:
the first circuit is configured to conditionally program in the first column address cycle the second non-volatile storage element based on a quota of programmable bits for the bay in one column address cycle.

3. The apparatus of claim 2, wherein:
the first circuit is configured to program in the first column address cycle the second non-volatile storage element if the first non-volatile storage element can be skipped and programming the second non-volatile storage element would not exceed the quota.

4. The apparatus of claim 3, wherein:
the first circuit is configured to program in a second column address cycle following the first column address cycle the second non-volatile storage element if the first non-volatile storage element can be skipped and programming the second non-volatile storage element would exceed the quota.

5. The apparatus of claim 2, wherein:
the quota is a first quota;
the first group of non-volatile storage elements is coupled to a first word line;
the first circuit is configured to determine whether a number of programmable bits in a first zone of the word line is less than or equal to the first quota and whether a number of programmable bits in a second zone of the word line is less than or equal to a second quota, the second quota is less than the first quota; and
the first circuit is configured to program in the first column address cycle the second non-volatile storage element if the first non-volatile storage element can be skipped, the number of programmable bits in the first zone is less than or equal to the first quota, and the number of programmable bits in the second zone is less than or equal to the second quota.

6. The apparatus of claim 5, wherein:
the first zone includes the first non-volatile storage element and the second non-volatile storage element;
the first zone includes non-volatile storage elements nearer to a word line driver for the first word line than non-volatile storage elements of the second zone; and
the first circuit is configured to determine the second quota based on the number of programmable bits in the first zone and the first quota.

7. The apparatus of claim 6, wherein:
if the number of programmable bits in the first zone is greater than the first quota, the first circuit is configured to program in the first column address cycle a first subset of the programmable bits in the first zone and to program in a second column address cycle a second subset of the programmable bits in the first zone.

8. The apparatus of claim 7, wherein:
if the number of programmable bits in the second zone is greater than the second quota, the first circuit is configured to program in the first column address cycle a first subset of the programmable bits in the second zone and to program in a second column address cycle a second subset of the programmable bits in the second zone.

9. The apparatus of claim 8, wherein:
the first subset of programmable bits in the second zone is equal to the second quota.

10. The apparatus of claim 1, wherein:
the first circuit is a first sense amplifier circuit.

11. The apparatus of claim 10, wherein:
the first sense amplifier circuit includes a first priority encoder configured to assign to the first sense amplifier the first column address for the first column address cycle in response to program data indicating that the first non-volatile storage element should be programmed; and
the first sense amplifier circuit includes a second priority encoder configured to assign to the second sense amplifier the second column address for the first column address cycle in response to program data indicating that the first non-volatile storage element can be skipped and the second non-volatile storage element should be programmed.

12. The apparatus of claim 11, wherein the bay includes a second group of non-volatile storage elements associated with the plurality of columns, the apparatus further comprising:
a second sense amplifier circuit associated with the second group and configured to program in the first column address cycle a first non-volatile storage element of the second group having the first column address in response to determining that the first non-volatile storage element of the second group should be programmed.

13. The apparatus of claim 12, further comprising:
one or more control circuits configured to read memory data from the bay of non-volatile storage elements prior to writing a set of user data and compare the set of user data to the memory data to determine whether programming can be skipped for each non-volatile storage element of the bay; and
wherein the one or more control circuits are configured to generate the program data to indicate a subset of non-volatile storage elements to be programmed for the bay based on comparing the set of user data to the memory data.

14. The apparatus of claim 13, wherein:
the first group of non-volatile storage elements and the second group of non-volatile storage elements are part of a common word line in the bay of non-volatile storage elements; and
the bay of non-volatile storage elements is part of a monolithic three-dimensional non-volatile memory array.

15. The apparatus of claim 11, wherein: the first sense amplifier circuit includes a first sense amplifier in communication with the first non-volatile storage element; and the first sense amplifier circuit includes a second sense amplifier in communication with the second non-volatile storage element.

16. A method of programming non-volatile storage, comprising:
programming a bay of non-volatile storage elements in a plurality of column address cycles, wherein the bay includes a first group of non-volatile storage elements associated with a plurality of columns and a second group of non-volatile storage elements associated with the plurality of columns; and
programming by a first circuit in a first column address cycle a second non-volatile storage element of the first group having a second column address based on determining that the second non-volatile storage element should be programmed and a first non-volatile storage element of the first group having a first column address can be skipped.

17. The method of claim 16, further comprising:
conditionally programming by the first circuit in the first column address cycle the second non-volatile storage element based on a quota of programmable bits for the bay in one column address cycle.

18. The method of claim 17, further comprising:
programming by the first circuit in the first column address cycle the second non-volatile storage element if the first non-volatile storage element can be skipped and programming the second non-volatile storage element would not exceed the quota.

19. The method of claim 18, further comprising:
programming by the first circuit in a second column address cycle following the first column address cycle the second non-volatile storage element if the first non-volatile storage element can be skipped and programming the second non-volatile storage element would exceed the quota.

20. The method of claim 17, wherein the quota is a first quota and the first group of non-volatile storage elements is coupled to a first word line, the method further comprising:
determining by the first circuit whether a number of programmable bits in a first zone of the word line is less than or equal to a first quota and whether a number of programmable bits in a second zone of the word line is less than or equal to a second quota, the second quota is less than the first quota; and
programming by the first circuit in the first column address cycle the second non-volatile storage element if the first non-volatile storage element can be skipped, the number of programmable bits in the first zone is less than or equal to the first quota, and the number of programmable bits in the second zone is less than or equal to the second quota.

* * * * *